(12) United States Patent
Lansbergen et al.

(10) Patent No.: US 9,457,947 B2
(45) Date of Patent: Oct. 4, 2016

(54) LITHOGRAPHIC APPARATUS AND DEVICE MANUFACTURING METHOD

(71) Applicants: Robert Gabriël Maria Lansbergen, Schiedam (NL); Peter C. Kochersperger, Easton, CT (US); David Ramirez, Danbury, CT (US); Xugang Xiong, Wilton, CT (US); George Hilary Harrold, Wilton, CT (US); Arindam Sinharoy, Wilton, CT (US)

(72) Inventors: Robert Gabriël Maria Lansbergen, Schiedam (NL); Peter C. Kochersperger, Easton, CT (US); David Ramirez, Danbury, CT (US); Xugang Xiong, Wilton, CT (US); George Hilary Harrold, Wilton, CT (US); Arindam Sinharoy, Wilton, CT (US)

(73) Assignee: ASML HOLDING N.V., Veldhoven (NL)

( * ) Notice: Subject to any disclaimer, the term of this patent is extended or adjusted under 35 U.S.C. 154(b) by 737 days.

(21) Appl. No.: 13/651,274

(22) Filed: Oct. 12, 2012

(65) Prior Publication Data

US 2013/0100430 A1 Apr. 25, 2013

Related U.S. Application Data

(63) Continuation-in-part of application No. PCT/EP2012/058876, filed on May 14, 2012.

(60) Provisional application No. 61/510,913, filed on Jul. 22, 2011.

(51) Int. Cl.

| | | |
|---|---|---|
| *G03B 27/72* | (2006.01) | |
| *B65D 81/02* | (2006.01) | |
| *G03F 7/20* | (2006.01) | |
| *G03F 1/24* | (2012.01) | |
| *G03F 1/66* | (2012.01) | |
| *H01L 21/673* | (2006.01) | |
| *B65B 5/04* | (2006.01) | |

(52) U.S. Cl.
CPC ............ *B65D 81/02* (2013.01); *B65B 5/04* (2013.01); *G03F 1/24* (2013.01); *G03F 1/66* (2013.01); *G03F 7/70716* (2013.01); *G03F 7/70741* (2013.01); *H01L 21/67359* (2013.01)

(58) Field of Classification Search
CPC .......... B65B 5/04; B65D 81/02; G03F 1/24; G03F 1/66; G03F 7/70716; G03F 7/70741; H01L 21/67359
USPC .......................................................... 355/75
See application file for complete search history.

(56) References Cited

U.S. PATENT DOCUMENTS

| | | | |
|---|---|---|---|
| 2004/0004704 A1* | 1/2004 | Wiseman ............... | G03B 21/62 355/75 |
| 2006/0087639 A1* | 4/2006 | Puerto ................... | B82Y 10/00 355/75 |

(Continued)

FOREIGN PATENT DOCUMENTS

| | | |
|---|---|---|
| EP | 1 806 774 | 7/2007 |
| JP | 2002-131605 | 5/2002 |

(Continued)

OTHER PUBLICATIONS

International Preliminary Report on Patentability mailed Feb. 6, 2014 in corresponding International Patent Application No. PCT/EP2012/058876.

(Continued)

*Primary Examiner* — Peter B Kim
(74) *Attorney, Agent, or Firm* — Pillsbury Winthrop Shaw Pittman LLP

(57) ABSTRACT

An apparatus and a method to hold a patterning device configured to impart a beam of radiation with a pattern in its cross-section. The apparatus includes a base configured to support the patterning device and an inner cover couplable to the base. The inner cover includes a restraining mechanism that, upon an application of a force external to the inner cover, is configured to provide an in-plane force to the patterning device to restrain movement of the patterning device, the in-plane force being substantially parallel to a patterning surface of the patterning device.

33 Claims, 22 Drawing Sheets

(56) References Cited

U.S. PATENT DOCUMENTS

2007/0085992 A1     4/2007    Chiu
2012/0175279 A1*   7/2012    Ku .................. G03F 7/70741
                                                           206/454

FOREIGN PATENT DOCUMENTS

| JP | 2004-071729 | 3/2004 |
| JP | 2009-510525 | 3/2009 |
| JP | 2009-229639 | 10/2009 |

OTHER PUBLICATIONS

International Search Report mailed Aug. 1, 2012 in corresponding International Patent Application No. PCT/EP2012/058876.
U.S. Office Action dated May 19, 2016 in corresponding U.S. Appl. No. 14/233,923.
Japanese Office Action mailed Jan. 30, 2015 in corresponding Japanese Patent Application No. 2014-522002.

* cited by examiner

LITHOGRAPHIC APPARATUS AND DEVICE MANUFACTURING METHOD

This application is a continuation-in-part of PCT Patent Application Serial No. PCT/EP2012/058876, filed May 14, 2012, which claims priority to U.S. Provisional Patent Application Ser. No. 61/510,913, filed Jul. 22, 2011, which are both incorporated by reference in their entireties herein.

FIELD

The present invention relates to a patterning device container, a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to be able to project ever smaller structures onto substrates, it has been proposed to use extreme ultraviolet (EUV) radiation which is electromagnetic radiation generally having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm.

An EUV patterning device may be stored, transported, and loaded into a lithography tool by a patterning device container. An example container is a dual pod which allows for significant protection of the patterning device from contamination. The dual pod has an EUV outer pod that encases an EUV inner pod (EIP). The EIP holds the patterning device directly.

SUMMARY

An EIP (or other patterning device container) may support the patterning device on four (4) points on the front or quality surface of the patterning device, outside of the used or quality area. In addition, the patterning device may be loaded against these points by four (4) other points on the back surface of the patterning device, thus effectively clamping the patterning device. This configuration constrains the patterning device in three degrees of freedom (DOE) (out-of-plane, not parallel to a patterning surface of the patterning device) directly via four (4) front side mounting points. The patterning device is further constrained in the remaining three DOF (in-plane, parallel to the patterning surface of the patterning device) by the friction between the patterning device and the mounting points.

This design should prevent the patterning device from sliding relative to the mounts during handling and shipping. However, even small sliding of the patterning device may result in an unacceptably high contamination of the patterning device. Because the patterning device is constrained in three DOF (in-plane) only by friction, the ability of this constraint to prevent sliding is determined by the clamping force and the coefficient of friction. The clamping force is limited due to practical considerations in the design of the pod. Further, contamination may be generated from clamping with too much force.

An EIP design using friction to constrain the in-plane DOFs may allow the patterning device to slide due to a ~4 g side load to the outer pod (g=~9.8 m/s$^2$). This represents contamination risk arising from handling of a pod and a risk/complexity for shipping the pod.

It would be advantageous, for example, to provide a patterning device container where a side edge of the patterning device is contacted in order to constrain the patterning device in the three DOF (in-plane) via direct contact, and not just via friction and/or clamping on the front and/or back surface of the patterning device. Further, it would be advantageous, for example, to achieve such restraint of the patterning device by moving one or more constraints to contact the patterning device with a force that is light enough to not significantly slide the patterning device. In an embodiment, after contact with the patterning device, the constraints may be locked in place with enough force to resist on the order of a 30 g force to prevent or reduce patterning device sliding during shipping and/or handling.

According to an aspect, there is provided an apparatus, comprising:

a base configured to support a patterning device configured to impart a beam of radiation with a pattern in its cross-section; and an inner cover couplable to the base, the inner cover comprising a restraining mechanism that, upon an application of a force external to the inner cover, is configured to provide an in-plane force to the patterning device to restrain movement of the patterning device, the in-plane force being substantially parallel to a patterning surface of the patterning device.

According to a further aspect, there is provided a method to process a patterning device configured to impart a beam of radiation with a pattern in its cross-section, the method comprising:

placing the patterning device upon a base;

coupling an inner cover to the base, the inner cover comprising a restraining mechanism; and applying a force external to the inner cover to the restraining mechanism such that the restraining mechanism provides an in-plane force to the patterning device to restrain movement of the patterning device, the in-plane force being substantially parallel to a patterning surface of the patterning device.

According to a further aspect, there is provided an apparatus comprising:

a base configured to support a patterning device configured to impart a beam of radiation with a pattern in its cross-section; and a restraining mechanism comprising:
a first member part of or coupled to a first brake member, the first member configured to move in a first direction in response to an external force to bend or pivot the first member;
a first block configured to engage the first brake member, wherein the first member is configured to move the first brake member into engagement with the first block; and
a pin, coupled to the first member and/or the first brake member, configured to transmit a force in the first direction to the patterning device and to substantially prevent the patterning device from movement.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
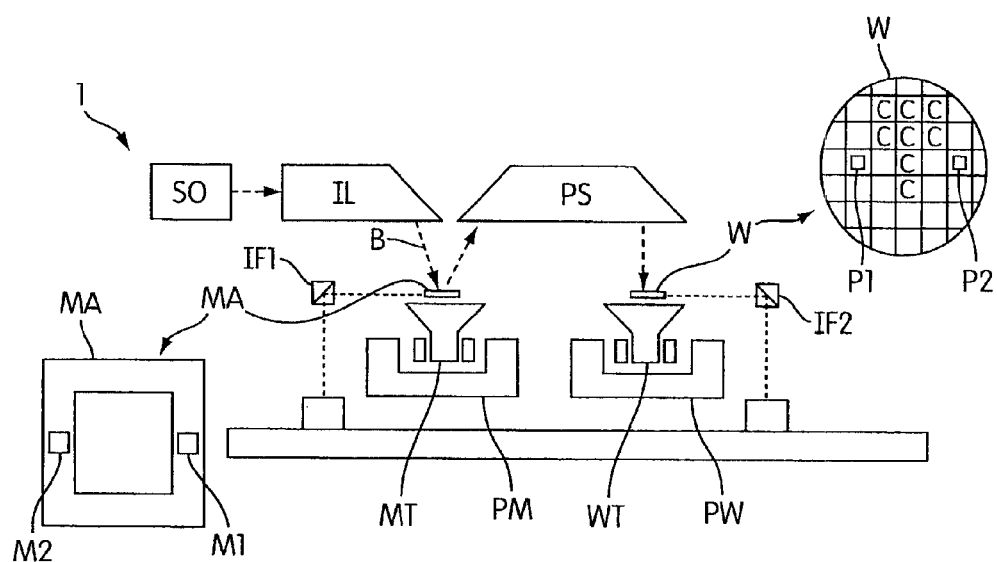
FIG. 1 schematically depicts a lithographic apparatus according to an embodiment of the invention.

FIG. 1 schematically depicts a lithographic apparatus 1 according to one embodiment of the invention. The apparatus comprises:
an illumination system (illuminator) IL configured to condition a radiation beam B (e.g. UV radiation or DUV radiation);
a support structure (e.g. a mask table) MT constructed to hold a patterning device (e.g. a mask) MA and connected to a first positioner PM configured to accurately position the patterning device in accordance with certain parameters;
a substrate table (e.g. a wafer table) WT constructed to hold a substrate (e.g. a resist-coated wafer) W and connected to a second positioner PW configured to accurately position the substrate in accordance with certain parameters; and
a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, to direct, shape, or control radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping or restraining techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. The patterning device has a patterning surface on which the pattern resides, and that is used to impart the pattern to the radiation beam. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a programmable mirror array of a type as referred to above, or employing a reflective mask). Alternatively, the apparatus may be of a transmissive type (e.g. employing a transmissive mask).

The lithographic apparatus may be of a type having two (dual stage) or more substrate tables (and/or two or more support structures). In such "multiple stage" machines the additional tables/support structures may be used in parallel, or preparatory steps may be carried out on one or more tables/support structures while one or more other tables/support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
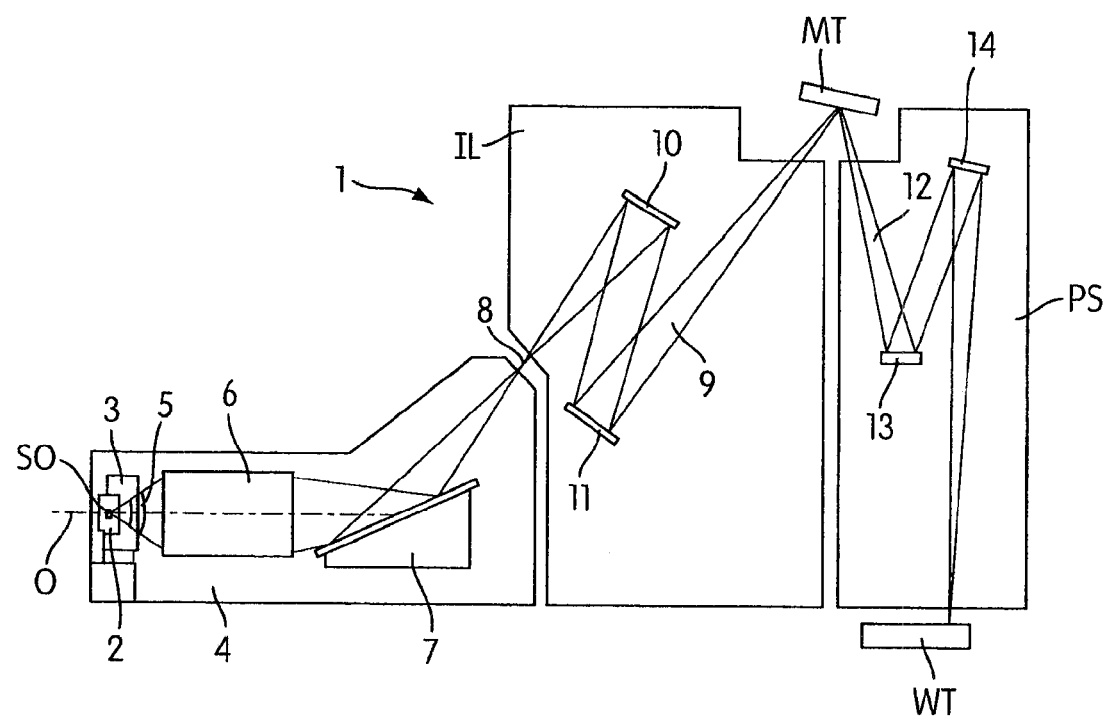
FIG. 2 depicts a detailed schematic illustration of a lithographic apparatus according to an embodiment of the invention.

FIG. 2 shows the apparatus 1 in more detail, including a radiation source SO, an illumination optics unit IL, and the projection system PS. The radiation source SO includes a radiation emitter 2 which may comprise a discharge plasma. EUV radiation may be produced by a gas or vapor, such as Xe gas or Li vapor in which a very hot plasma is created to emit radiation in the EUV radiation range of the electromagnetic spectrum. The very hot plasma is created by causing a partially ionized plasma of an electrical discharge to collapse onto an optical axis O. Partial pressures of e.g. 10 Pa of Xe or Li vapor or any other suitable gas or vapor may be desired for efficient generation of the radiation. In some embodiments, tin may be used. The radiation emitted by radiation emitter 2 is passed from a source chamber 3 into a collector chamber 4. In an embodiment, the radiation source SO includes the source chamber 3 and collector chamber 4.

The collector chamber 4 includes a contamination trap 5 and grazing incidence collector 6 (shown schematically as a rectangle). Radiation allowed to pass through the collector 6 is reflected off a grating spectral filter 7 to be focused in a virtual source point 8 at an aperture in the collector chamber 4. From collector chamber 4, a beam of radiation 9 is reflected in illumination optics unit IL via first and second normal incidence reflectors 10, 11 onto a patterning device (e.g., a mask) positioned on support structure MT. A patterned beam 12 is formed which is imaged in projection system PL via first and second reflective elements 13, 14 onto a substrate (not shown) held on a substrate table WT. More elements than shown may generally be present in illumination optics unit IL and projection system PL.

Figure 3:
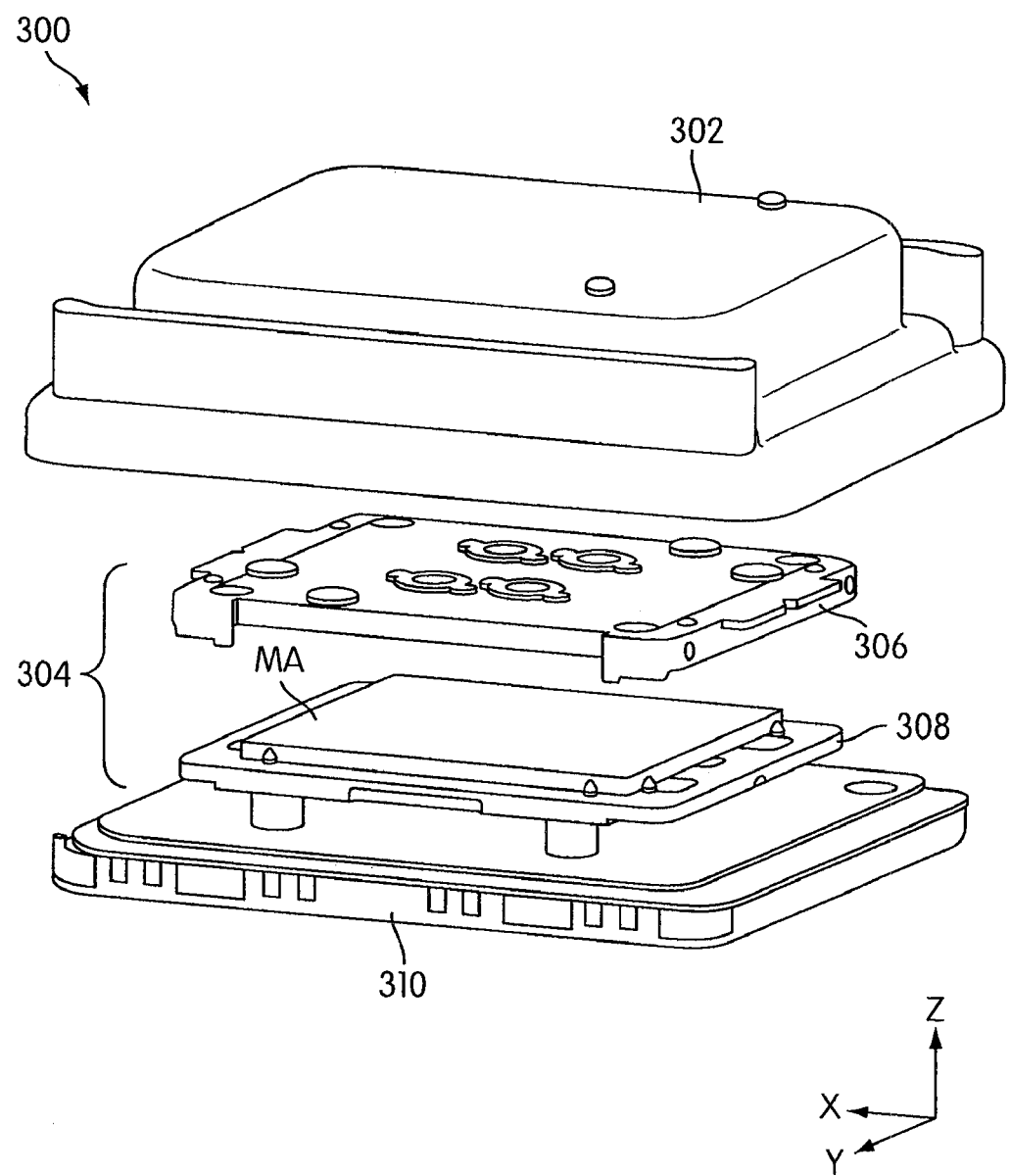
FIG. 3 depicts a support structure including a container for a patterning device according to an embodiment of the invention.

FIG. 3 shows a container 300, in which an EUV radiation reflective patterning device MA is stored for transportation, storage and/or handling purposes. Container 300 comprises an outer cover 302, an outer base 310, and an inner pod 304. Inner pod 304 includes an inner cover 306 (interchangeably referred to as "cover 306") and an inner base 308 (interchangeably referred to as "base 308"), all of which may be jointly referred to as a dual pod. Patterning device MA is held inside inner pod 304 on base 308, although in an embodiment, patterning device MA may be held by cover 306. In this example, patterning device MA is held by one or more restraining mechanisms. Inside container 300, an atmosphere of a protective (inert) gas may be maintained, for example, at a pressure above ambient pressure. However, a vacuum may instead be maintained inside container 300. In the latter case, a sufficient sealing may be provided between outer cover 302 and outer base 310 and/or between cover 306 and base 308 to prevent or hinder a gas flow between the inside of container 300 and its ambient environment that may contaminate the inside environment of container 300. Patterning device MA may be placed in inner pod 304 immediately after production or after a scanning procedure, ensuring that patterning device MA is substantially free of contamination when it is placed in inner pod 304. When placed inside inner pod 304, patterning device MA is substantially shielded from contaminants.

As disclosed in detail herein, inner pod 304 includes one or more restraining mechanisms to help reduce or prevent sliding or movement of patterning device MA that may generate particles, which could render patterning device MA less effective and potentially useless for photolithography operation. By way of example, such a restraining mechanism may include one or more selected from: a clamp, a groove, a pin, a fixation block, a spring, and/or the like.

In an embodiment, there is no metallic contact between inner cover 306 and inner base 308, as will be discussed below. Inner pod 304, with inner cover 306 coupled to inner base 308 in a closed position holding patterning device MA, rests securely on outer base 310 with outer cover 302 closed with outer base 310. In an embodiment, such an arrangement may be reversed where inner pod 304 can be arranged to be attached to an inside area (not visible in FIG. 3) of outer cover 302, and be brought in secure closure with outer base 310. In an embodiment, the particular orientation of inner cover 306 and inner base 308 as shown in FIG. 3 may be interchanged. For example, base 308 may be brought into closure with inner cover 306 such that base 308 rests on top of inner cover 306 with patterning device MA facing in a downward direction (−Z axis) relative to the base 308 as opposed to in an upward direction (+Z axis) as shown in FIG. 3. Similarly, other arrangements can be contemplated for outer cover 302 and outer base 310.

In an embodiment, a surface of outer cover 302 and/or outer base 310 may be transparent to a beam of radiation. In an embodiment, outer cover 302 and/or outer base 310 may be opaque. Similarly, in an embodiment, a surface of inner cover 306 and/or inner base 308 may be transparent to a beam of radiation. In an embodiment, inner cover 306 and/or inner base 308 may be opaque. Where a transparent surface is provided, patterning device MA can be scanned for, for example, particles and/or aligned through such transparent surface. The transparent surface may be glass or plexiglass.

Figure 4A:
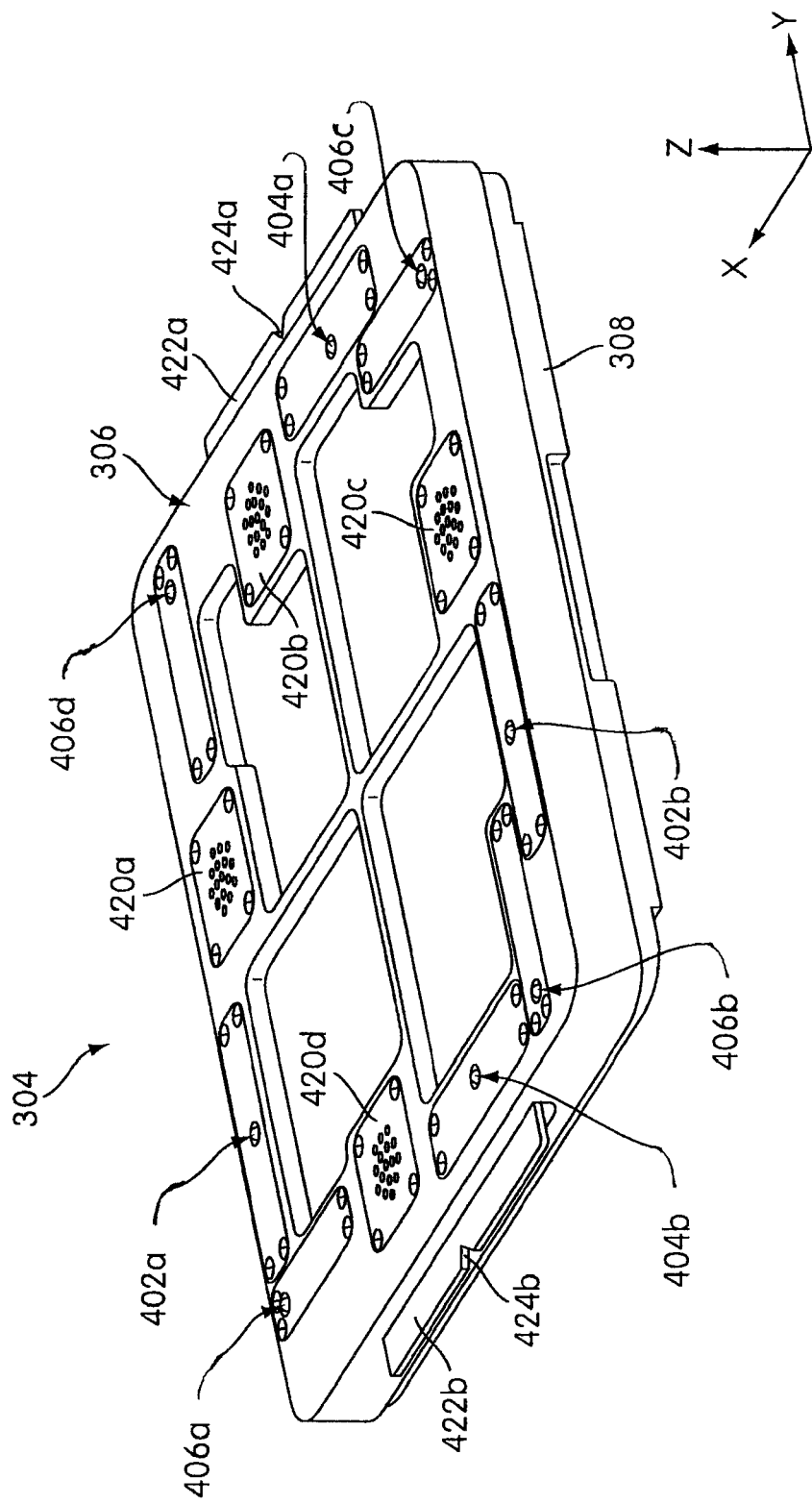
FIGS. 4A and 4B show top and bottom views of an EUV inner pod according to an embodiment of the invention.

FIG. 4A illustrates a top view of an embodiment of inner pod 304 showing various structural features of a top surface of inner cover 306 attached to inner base 308. In the top view, an example of a mechanism to restrict movement of patterning device MA inside inner pod 304 includes various pins for fixation in three mutually perpendicular directions (e.g., X, Y, and Z axis corresponding to respective degrees of freedom). For example, pins 402a and 402b are pushed in a downward direction (−Z axis towards inner base 308) by a corresponding pin/ball mechanism (not shown) in an inside surface of outer cover 302 to restrain motion of patterning device MA inside inner pod 304 in the X-direction (and at least partly in the $\theta_z$, direction). Similarly, pins 404a and 404b are pushed in a downward direction (−Z axis) by a corresponding pin/ball mechanism (not shown) in the inside surface of outer cover 302 to restrain motion of patterning device MA inside inner pod 304 in the Y-direction (and at least partly in the $\theta_z$, direction). In addition, four pins 406a-406d provide fixation or clamping of patterning device MA in the Z-direction by a corresponding pin/ball mechanism (not shown) in an inside surface of outer cover 302. When the inner surface of outer cover 302 comes into contact with the outer surface of the inner pod 304, the various pins 402-406 are engaged by a corresponding mechanism or structure on the inner surface of the outer cover 302.

Additionally, the top surface of inner cover 306 has one or more filter covers 420a-420d as part of a filter mechanism to pump a gas in a chamber formed inside inner pod 304, and/or to vent gas out from the chamber, as will be described with respect to FIGS. 10 and 11. Filter covers 420a-420d are attached to cover 306 by one or more screws, for example, although other mechanisms for attachment of filter covers 420a-420d may be used. Cover 306 has one or more side projections 422a-422b that may provide attachment to outer cover 302 at respective cut-out portions 424a and 424b, when outer cover 302 is brought in contact with inner pod 304. Additionally or alternatively, the side projections 422a-422b may be used to hold the inner cover 306 to disconnect inner base 308 and inner cover 306 from each other by, for example, lowering base 308 from the cover 306 and/or lifting cover 306 using the side projections 422a-442b from base 308. It is to be noted that the number of pins, filter covers, projections, etc. shown in FIG. 4A is by way of example only; other numbers of such elements may be used. Similarly, the orientation and positioning of the elements is exemplary only, and is not meant to be limiting. For example, each of the elements 402a-402b, 404a-404b, 406a-406d, side projections 422a-422b, cut-out portions 424a-424b, and filter covers 420a-420d can be located in other regions of the cover 306 and/or be located on base 308.

Figure 4B:
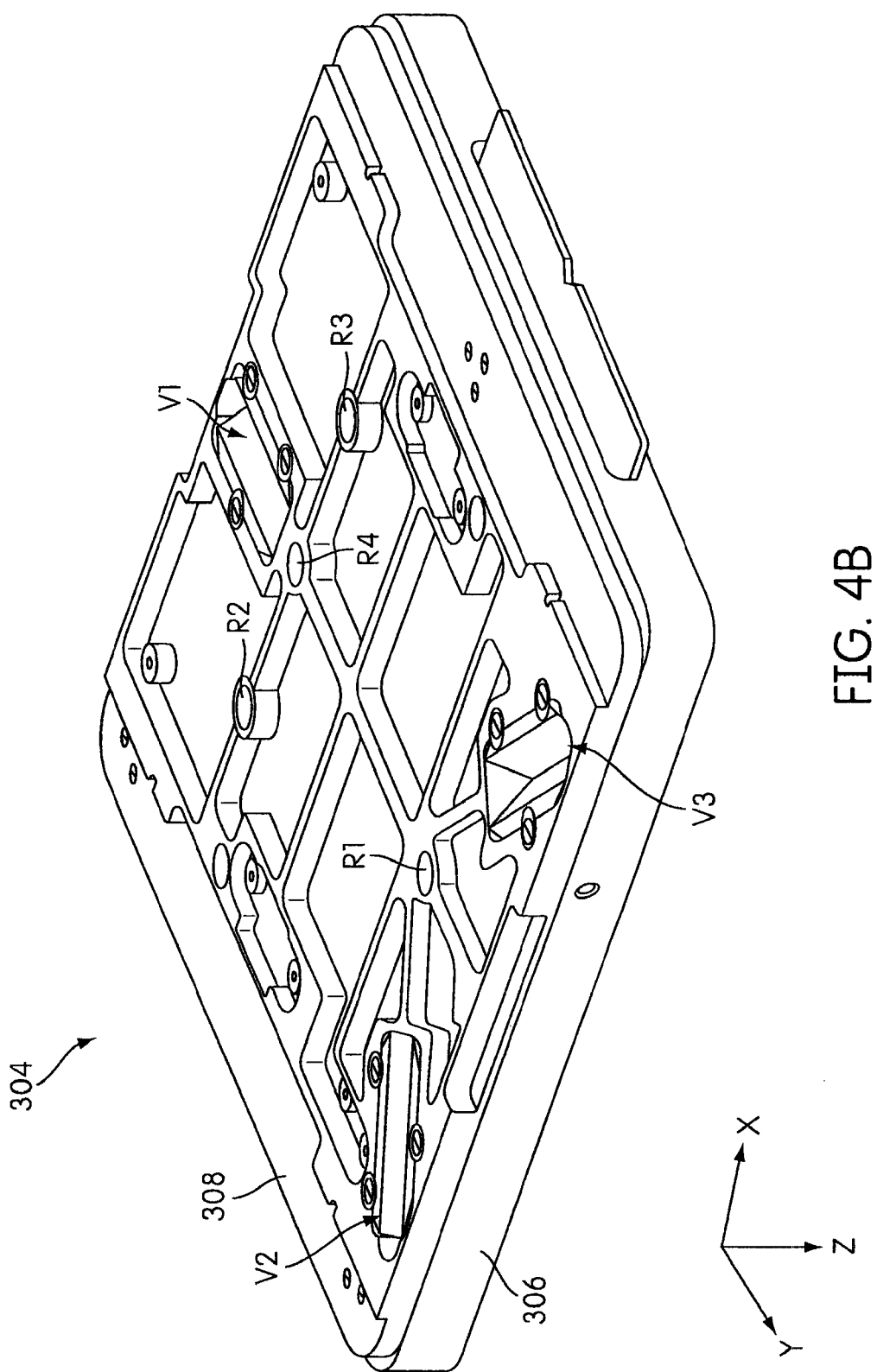

FIG. 4B shows a bottom view of an embodiment of inner pod 304 showing a bottom surface of inner base 308. The bottom side of base 308 has three V-shaped grooves V1-V3. In an embodiment, V-shaped grooves V1-V3 are separable components from base 308 and are attached to the base 308 via one or more screws, although another type of attachment could be used. Additionally, other numbers and/or other shapes of grooves may be used. V-shaped grooves V1-V3 are arranged to accommodate or receive pins on outer base 310 (not shown) which when in contact with V-shaped grooves V1-V3 operate to restrain movement of inner pod 304 during storage, handling and/or transportation. In an embodiment, the V-shaped grooves comprise a diamond-like carbon (DLC) material. Additionally or optionally, the bottom side of base 308 includes sockets R1-R4 for receiving additional corresponding pins on outer base 310 when inner pod 304 is placed on outer base 310. It is to be noted that the bottom side of inner base 308 may be designed to accommodate additional grooves and sockets, depending upon specific applications.

Figure 4C:
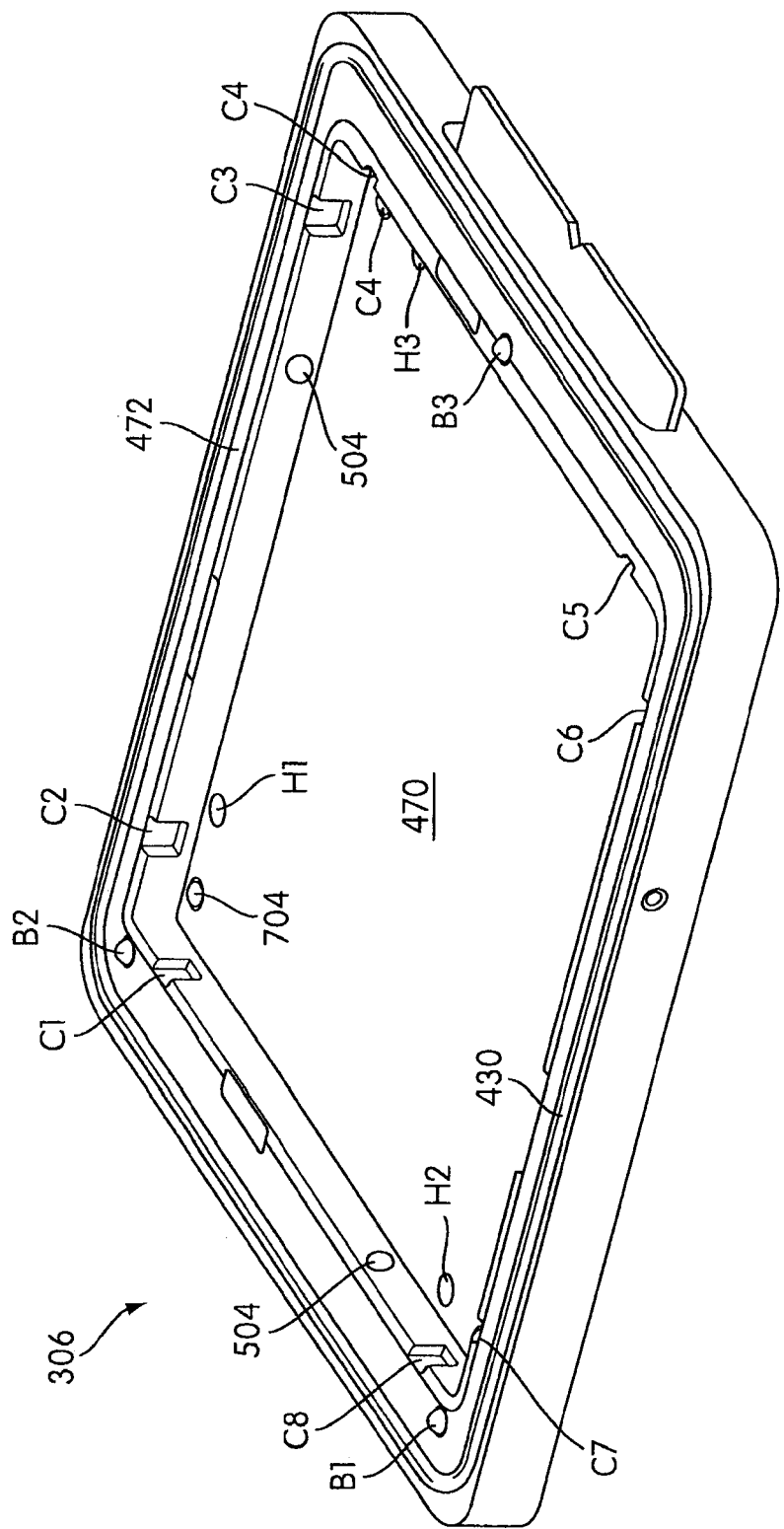
FIG. 4C shows inside surfaces of an inner cover of the EUV inner pod according to an embodiment of the invention.
Figure 12A:
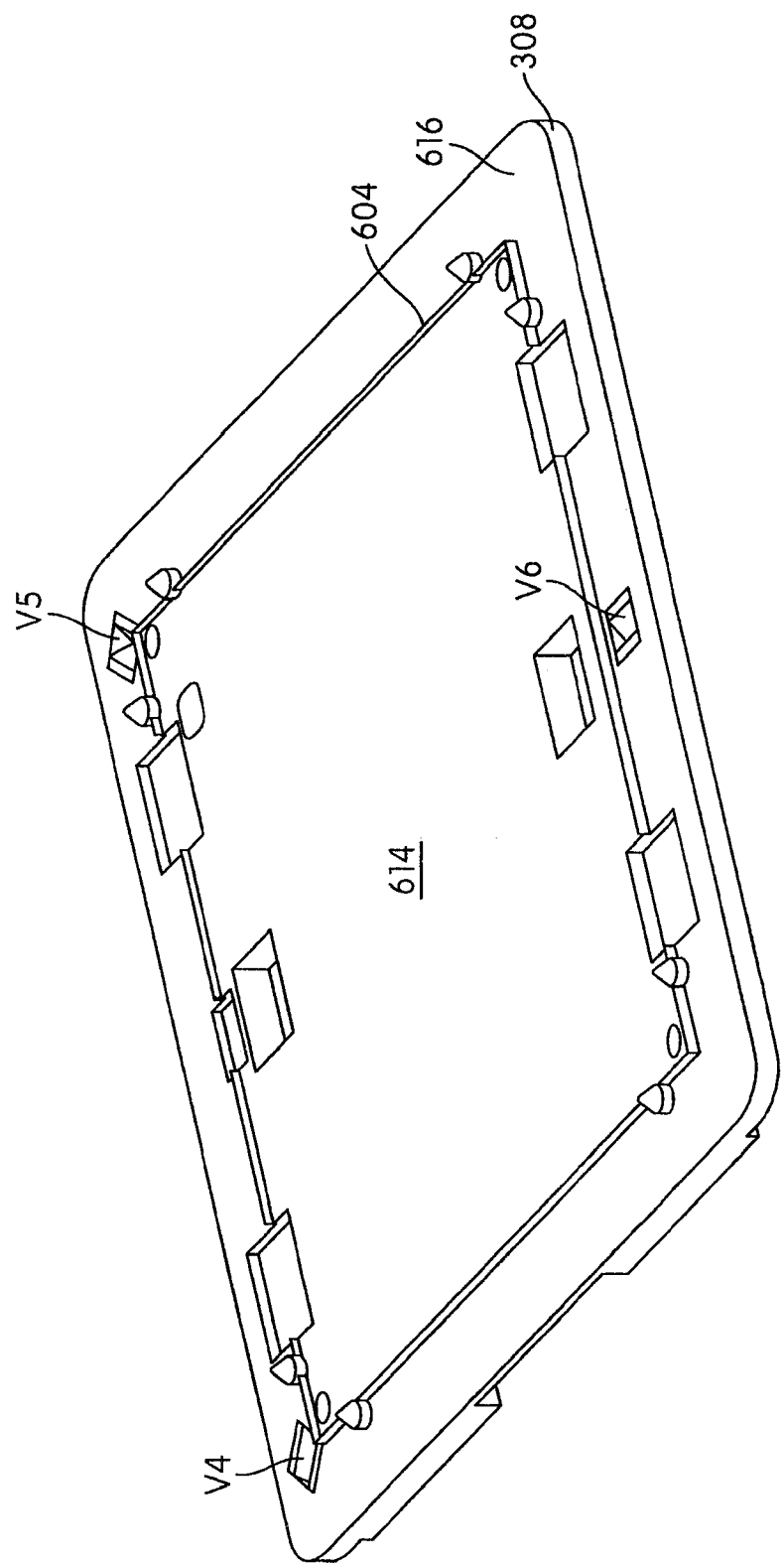
FIGS. 12A-12C show an arrangement of V-shaped grooves on a base of the inner pod according to an embodiment of the invention.
Figure 12B:
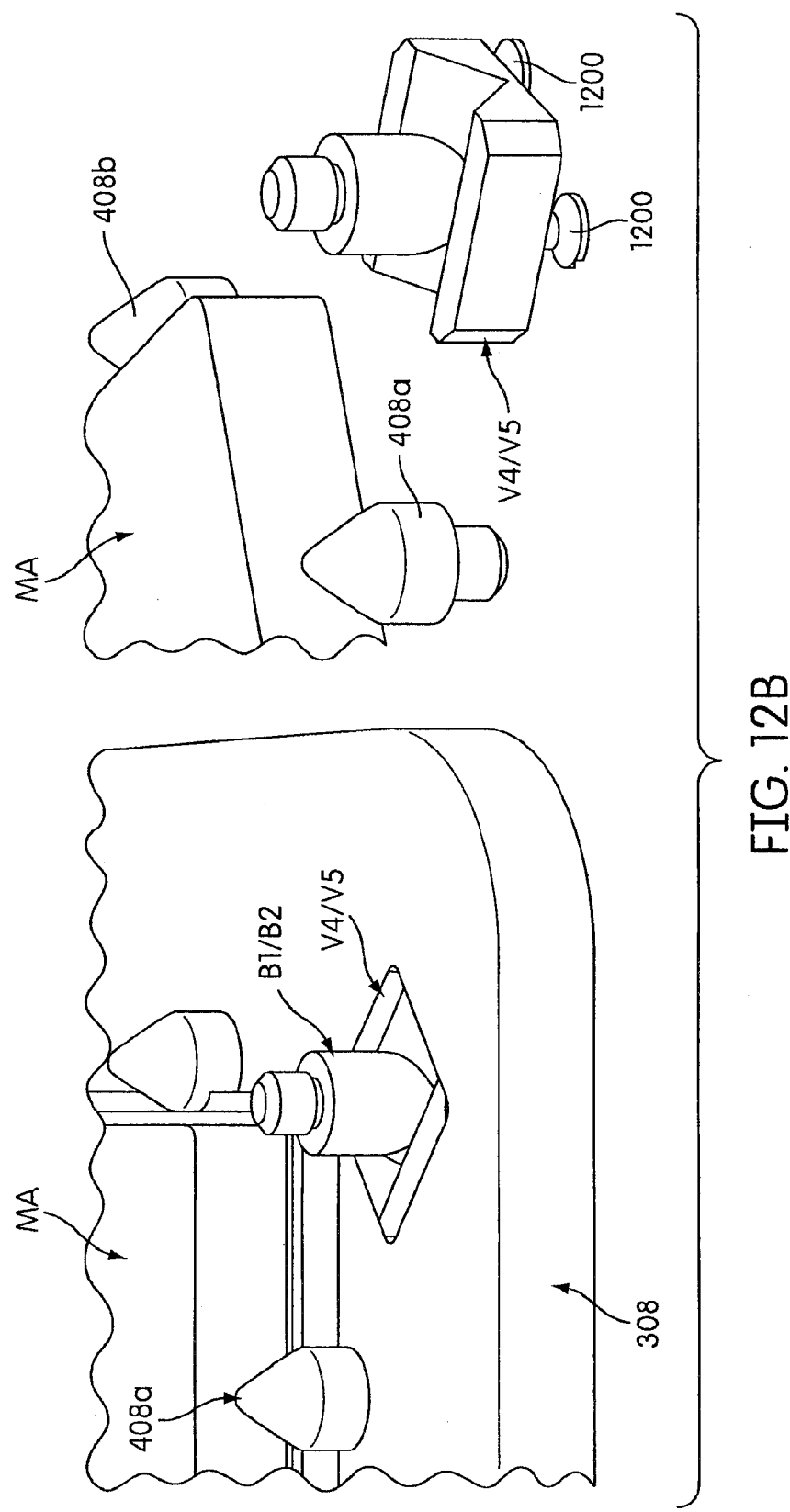
Figure 12C:
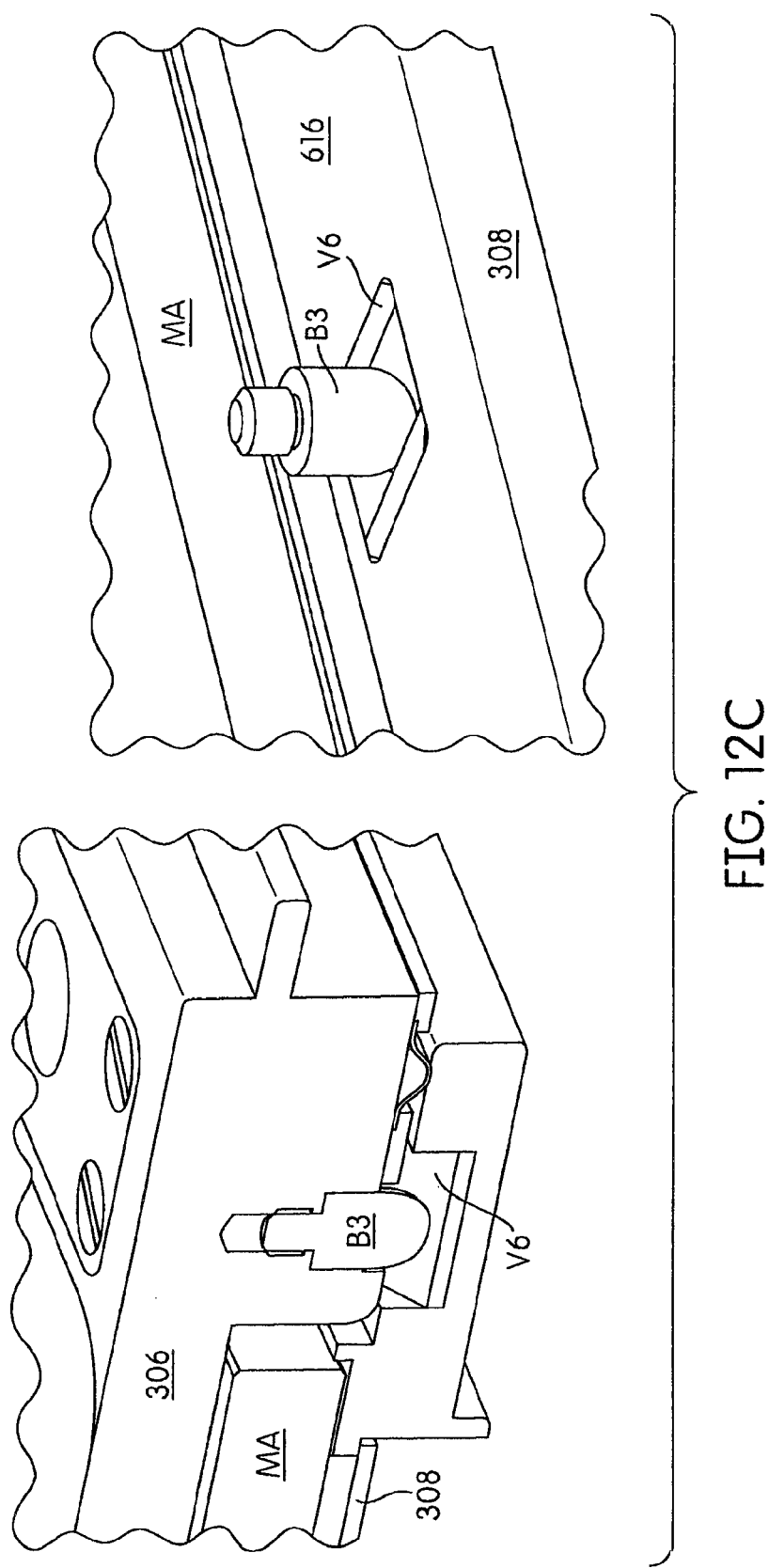

FIG. 4C illustrates an inside view of inner cover 306 of inner pod 304. The inside surface includes a first surface 470 and a second surface 472 in a plane different from a plane containing first surface 470, and lying at a periphery of cover 306. Second surface 472 includes a hollow 430 that holds or can accommodate an O-ring seal (not shown) to prevent direct metallic contact between inner cover 306 and base 308. Second surface 472 has one or more pins shown as balls B1-B3 for placement into corresponding V-shaped grooves on base 308, as shown in FIGS. 12A-12C, although other shapes instead of balls (e.g., pointed/tapered pins) may be used. First surface 470 includes one or more contact pins 704 to clamp patterning device MA in a direction towards inner base 308. First surface 470 also includes one or more contact pins 504 to engage and restrain patterning device MA in a plane substantially parallel to the patterning device holding surface of inner base 308, i.e., in a plane substantially parallel to the front surface of patterning device MA. Further, first surface 470 includes covered holes H1-H4 (only H1-H3 shown) to allow, for example, a patterning device alignment beam to reach the patterning device MA. Additionally, one or more cut-outs C1-C8 may be provided on second surface 472 to accommodate support pins 408a-408h of FIG. 4D.

Figure 4D:
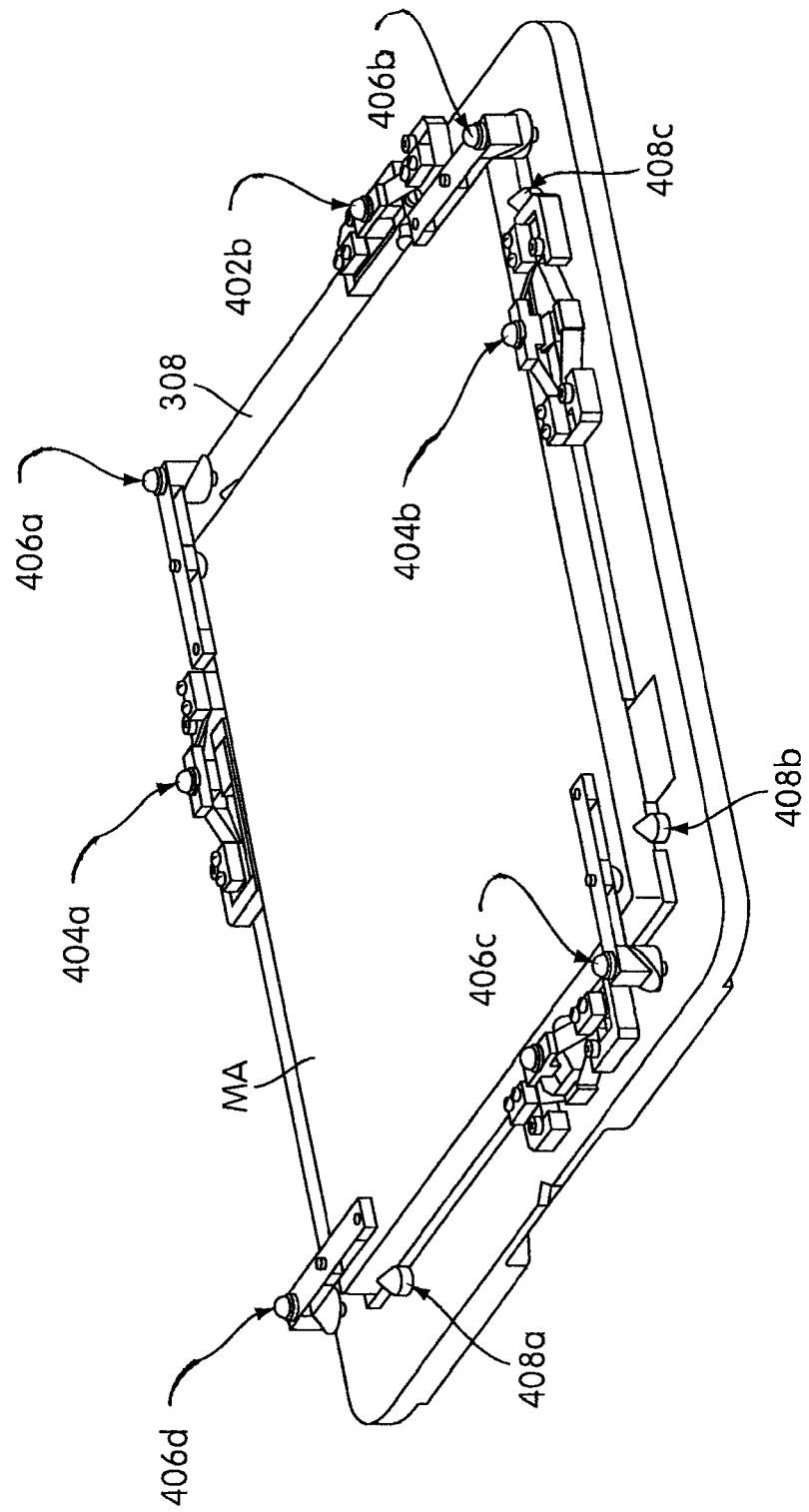
FIG. 4D shows a view of a restraining mechanism for a patterning device according to an embodiment of the invention.

Inner cover 306 includes one or more restraining mechanisms (not shown) having, in an embodiment, one or more leaf spring arrangements shown, e.g., in FIG. 4D with surfaces 470 and 472 removed for visual clarity. The leaf spring arrangement interacts with patterning device MA upon application of a force external to inner pod 304 to restrain movement of patterning device MA, resulting in a minimization of particle generation in inner pod 304. In particular, the leaf spring attachment may be connected to the one or more contact pins 704 and/or the one or more contact pins 504. Further, the leaf spring attachment may be connected to the pins 402, pins 404 and/or pins 406. In one embodiment, inner cover 306 has additional restraining mechanism that provides an out-of-plane force to restrain patterning device MA. For example, such out-of-plane force may be perpendicular to the in-plane force, and may be used for clamping patterning device MA.

FIG. 4D illustrates inner base 308 with patterning device MA placed on base 308, and restrained by various components of the restraining mechanism, as described below. The restraining mechanism as shown in FIG. 4D does not include the outer shell with surfaces 470 and 472 of inner cover 306 inside which this restraining mechanism actually resides. Base 308 includes one or more limit pins 408a-408h (only 408a, 408b, and 408c are visible in FIG. 4D) that can, in exceptional circumstances, contact patterning device MA at different sides of patterning device MA to limit in-plane (X, Y and $\theta_z$) movement thereof. Pins 402a-402b, 404a-404b, and 406a-406d are parts of leaf spring restraining mechanisms that restrict movement of patterning device MA, e.g., when outer cover 302 is brought in contact with inner cover 306. Specifically, when outer cover 302 comes in contact with inner cover 306 to push pins 402a-402b, 404a-404b, and 406a-406d, the respective leaf spring mechanisms associated with pins 402a-402b, 404a-404b, and 406a-406d are actuated to restrain or fixate patterning device MA in place. In an embodiment, the leaf spring mechanisms can be activated when inner cover 306 is brought in contact with base 308, e.g., when base 308 is on top on cover 306 and resting on cover 306. Generally, the leaf spring mechanism is activated by any force external to inner cover 306 being applied at one or more of pins 402a-402b, 404a-404b, and 406a-406d. It is to be noted that although a leaf spring mechanism is illustrated because it may help minimize contaminant particles resulting from contact between various elements in inner pod 304, in another embodiment, another mechanism such as regular springs may be used instead of or in addition to a leaf spring mechanism to restrain patterning device MA. Further, the leaf spring mechanism can be integrally fabricated as part of inner cover 306, or can be attached using screws or latches. Operation of the leaf spring mechanism is described in more detail with respect to FIGS. 5A-5C, 6, and 7A-7B.

Figure 5A:
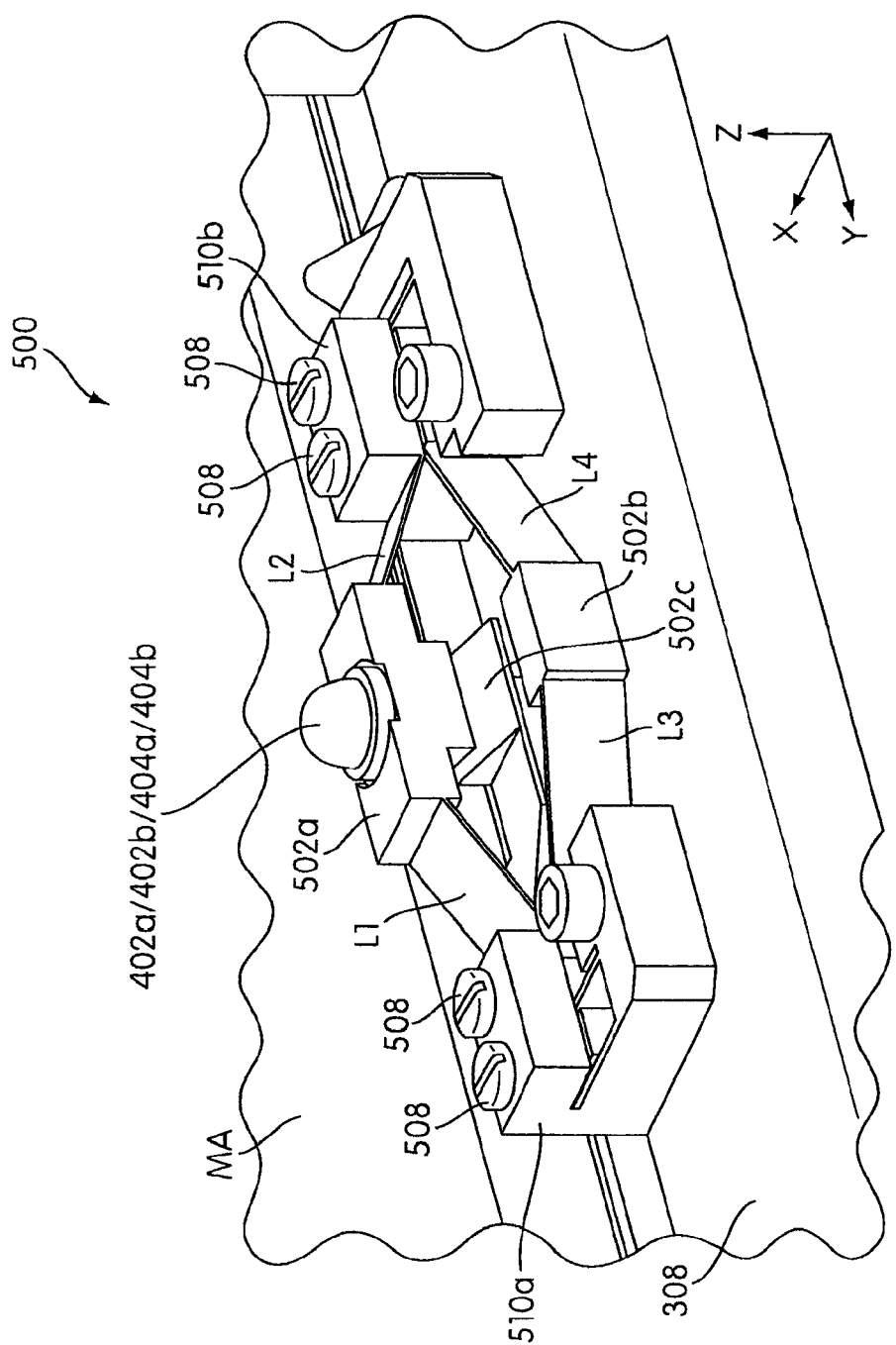
FIGS. 5A-5D show views of a leaf spring mechanism to restrain in-plane movement of the patterning device according to an embodiment of the invention.
Figure 5B:
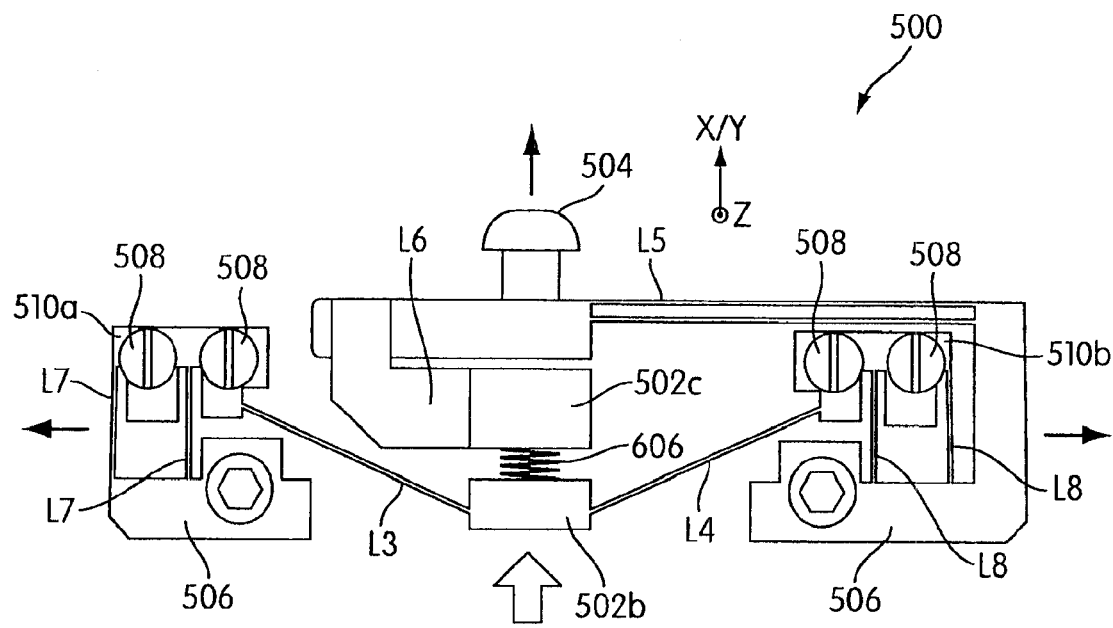
Figure 5C:
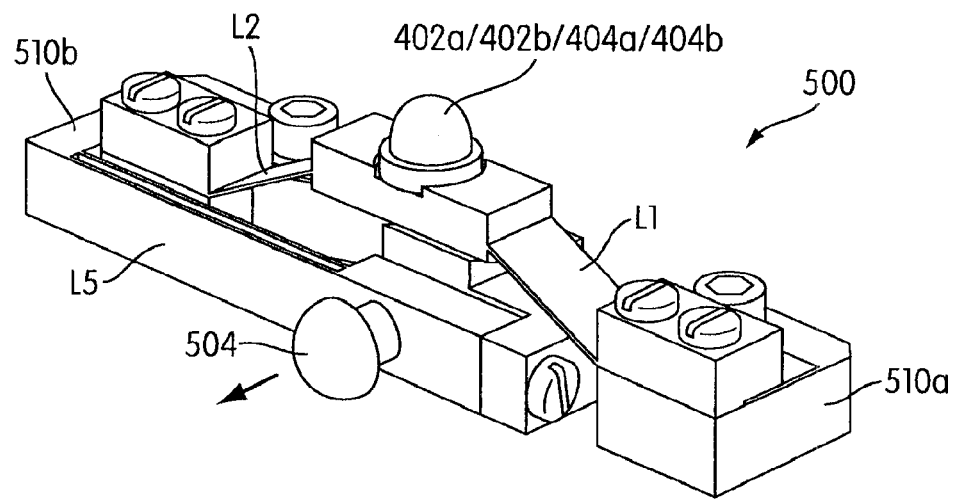

FIGS. 5A-5C illustrate an exemplary restraining mechanism arranged to restrain movement of patterning device MA in X, Y and $\theta_z$ directions along a plane substantially parallel to the patterning surface of patterning device MA. FIG. 5A illustrates a leaf spring mechanism 500 formed in inner cover 306 (not shown) that has a first pair of leaf springs including a leaf spring L1 and a leaf spring L2 joined together by a fixation block 502a at one end of each of leaf springs L1 and L2. The leaf springs L1 and L2 are each attached at their respective others ends to blocks 510a and 510b, respectively. One or more fasteners 508 may be used to fasten the leaf springs L1 and L2 to blocks 510a and 510b and/or to fasten blocks 510a and 510b (and the leaf springs L1 and L2) to another structure. Fixation block 502a includes a pin, for example, one of pins 402a, 402b, 404a, or 404b, depending upon a direction of restraining provided by leaf spring mechanism 500, to receive an external force, e.g., from outer cover 302. In an embodiment, the pin can be an integral part of fixation block 502a itself, and may be in a different shape (e.g., a tapered shape or a rectangular block). Further, an extended part of fixation block 502a itself can perform the same function as the pins 402a, 402b, 404a, or 404b such that fixation block 502a directly receives the external force to actuate leaf spring mechanism 500.

When pushed towards base 308, e.g., at pin 402a, fixation block 502a moves downward towards base 308. Such downward motion of fixation block 502a causes leaf spring pair L1, L2 to move from a first position to a stretched second position that further causes a block 502b to move towards patterning device MA along a plane substantially parallel to the patterning surface of patterning device MA. Such motion of block 502b is shown, by way of example only, using an arrow adjacent block 502b in FIG. 5B. Further, the downward movement may bring fixation block 502a in contact with or into near contact with a fixation block 502c that is connected to leaf spring pair L5 illustrated in FIGS. 5B and 5C.

Leaf spring mechanism 500 includes a second pair of leaf springs L3 and L4 arranged to move in a plane perpendicular to a plane of movement of leaf spring pair L1, L2. Leaf springs L3 and L4 at one end are joined together by block 502b. Leaf springs L3 and L4 at respective other ends are joined to blocks 510a and 510b respectively. When fixation block 502a moves down, it causes the first leaf spring pair L1, L2 to stretch and push blocks 510a and 510b away from each other, as illustrated by the directional arrows adjacent blocks 510a and 510b. As described with respect to FIG. 5B, it is this movement of blocks 510a and 510b that is transmitted by mechanical coupling via leaf springs L3 and L4 to move block 502b and thereby pin 504 to provide an in-plane force that restrains movement of patterning device MA without little or no generation of contaminant particles due to excessive sliding or contact.

FIG. 5B shows a top view of a part of leaf spring mechanism 500 with leaf spring pair L1, L2 removed for visual clarity purposes only. A set of leaf springs L7 and L8, each including one or more individual leaf springs are used to couple blocks 510a and 510b with ground parts 506 of leaf spring mechanism 500. When blocks 510a and 510b are moved away from each other by the stretching action of leaf springs L1, L2, leaf springs L7 and L8 bend and follow the motion of 510a and 510b, respectively. As a result, ends of leaf springs L3, L4 attached to blocks 510a and 510b also move away from each other causing the leaf spring pair L3, L4 to stretch. The motion of leaf springs L3, L4 causes block 502b to move towards patterning device MA. Block 502b when moved towards patterning device MA, pushes fixation block 502c such that fixation block 502c is aligned directly below fixation block 502a. Such movement of block 502b compresses a spring 606 that couples to fixation block 502c and provides compressive force to fixation block 502c that causes pin 504 to contact patterning device MA. Contact with pin 504 provides an in-plane force to restrain patterning device MA as described in the force diagram shown in FIGS. 8A and 8B. In this configuration, there exists a pre-biasing force within a plane substantially parallel to a patterning surface of patterning device MA, as described for example, in FIGS. 9A and 9B. In an embodiment, fixation block 502c, or an extension thereof, can be made to contact patterning device MA to provide the restraining in-plane force to patterning device MA.

When fixation block 502a is moved downward, for example, using pin 402a when outer cover 302 comes in contact with inner cover 306 of inner pod 304, fixation block 502a comes in contact with or into near contact with fixation block 502c. Such contact of fixation block 502a with fixation block 502c as a result of a downward force at pins 402a, 402b, 404a, or 404b provides a locking opposing force to in-plane movement of patterning device MA. If the fixation block 502a were in near contact with fixation block 502c, then slight movement of the patterning device MA may cause the fixation block 502a and fixation block 502c to come into contact, at which time a locking opposing force to in-plane movement of patterning device MA would be provided.

Leaf spring mechanism also includes a leaf spring L5 connecting block 502c with a ground part 506, the leaf spring L5 arranged to move in the X-direction (or, depending on the location of leaf spring mechanism 500, the Y-direction) cooperatively with movement of pin 504, and a leaf spring L6 coupled to fixation block 502c and arranged to cooperatively move fixation block 502c when pushed or contacted by blocks 502a and/or 502b to align a surface of fixation block 502c with a surface of fixation block 502a. FIG. 5C shows another view of leaf spring mechanism 500.

Figure 5D:
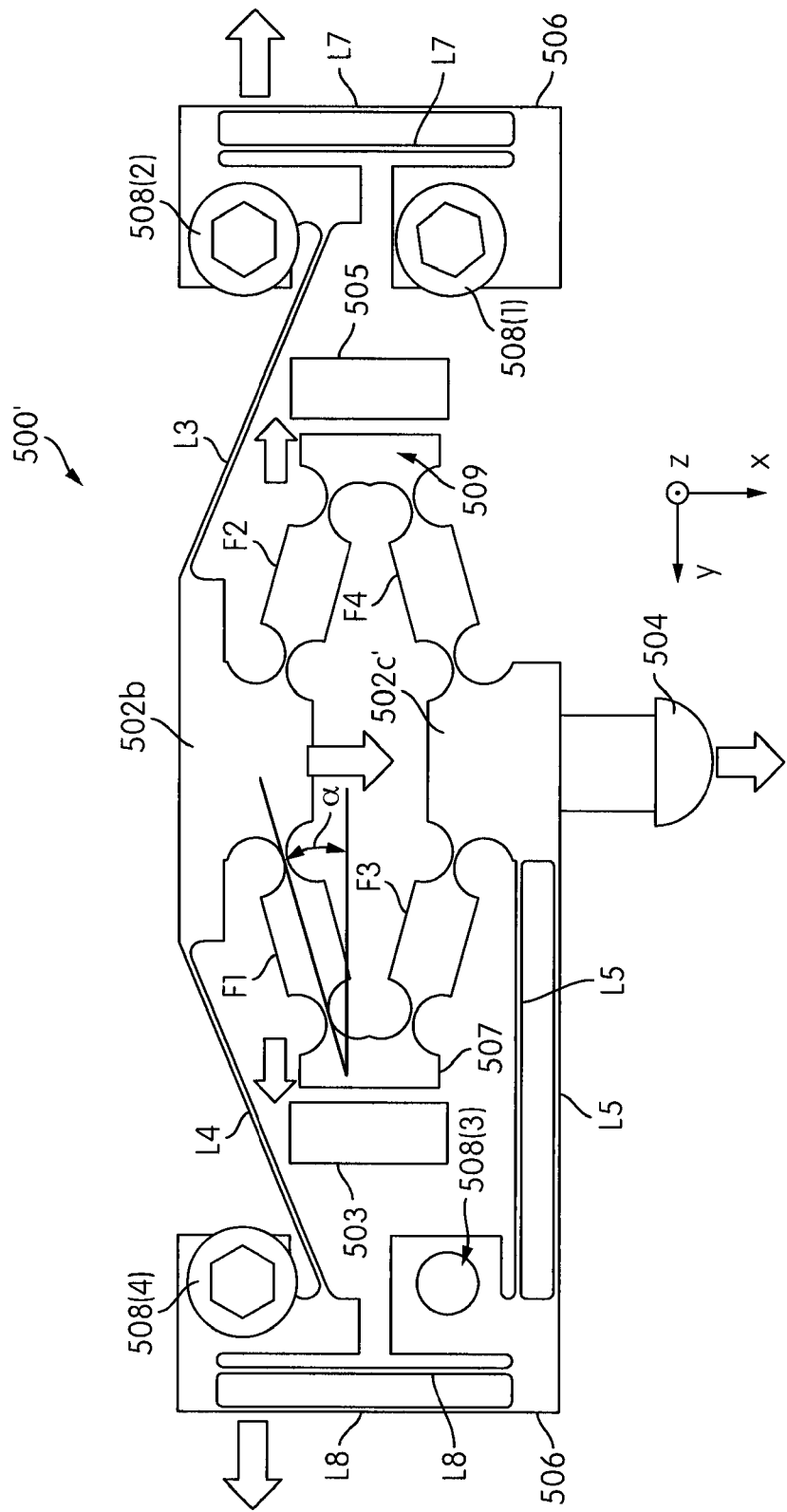

FIG. 5D shows a further arrangement of an exemplary restraining mechanism arranged to restrain movement of patterning device MA in X, Y and $\theta_z$ directions along a plane substantially parallel to the patterning surface of patterning device MA. FIG. 5D illustrates a modified leaf spring mechanism 500' formed in inner cover 306, and coupled to inner base 308. In comparison with FIG. 5B, instead of block 502b receiving a force external to inner pod 304 and transmitting the force to coil spring 606 that pushes fixation block 502c and leaf spring L6, in FIG. 5D block 502b is coupled to members F1 and F2 on opposite sides of an X-axis running through the central portion of block 502b. These members F1 and F2 are in addition to leaf springs L3 and L4. Member F1 couples to a moveable brake member 507, and member F2 couples to a moveable brake member 509. Likewise, instead of fixation block 502c coupled to leaf spring L6 (as illustrated in FIG. 5B), modified leaf spring mechanism 500' comprises a fixation block 502c' coupled to leaf spring L5 and pin 504 on one side of fixation block 502c'. In an embodiment, the fixation block 502c' is coupled to members F3 and F4 on another side of block 502c'. Similar to members F1 and F2, members F3 and F4 are arranged on opposite sides of fixation block 502c' of an X-axis running through the central portion of block 502c'. Member F3 further couples to moveable brake member 507 and member F4 further couples to moveable brake member 509. In one arrangement, one or more of the members F1-F4 is at least in part flexible (i.e., not rigid), and may bend, stretch, or compress. In an embodiment, one or more of the members F1-F4 may have a pivoting feature, e.g., a bearing, at at least one end of the respective member F1-F4.

Further, modified leaf spring mechanism 500' comprises a block 503 and block 505, fixed relative to the brake members 507 and 509, arranged to engageably oppose or prevent motion of moveable brake members 507 and 509, respectively, upon contact. Blocks 503 and 505 provide or act as additional or alternative sources of friction to help prevent movement of patterning device MA compared to, for example, the frictional forces in the embodiment of FIG. 5B.

Similar to the arrangement in FIG. 5B, in FIG. 5D a set of leaf springs L7 and L8, each including one or more individual leaf springs, are coupled to ground parts 506 of modified leaf spring mechanism 500'. It is to be noted that the specific number, orientation and arrangement of fixation blocks 502b, 502b', members F1-F4, moveable brake members 509, 507, and blocks 503, 505, and other components of modified leaf spring mechanism 500' are by way of example only, and not by way of limitation, and other numbers, orientations, or arrangements may be contemplated by one of ordinary skill in the art in view of this disclosure.

In use, upon application of an external force in the Z-direction, block 502b moves towards fixation block 502c' in a first direction (e.g., X-direction as indicated by an arrow on block 502b) due to movement of various parts as described above with respect to the FIG. 5B. This external force is transmitted to, and may bend or cause pivoting of, members F1 and F2. Members F1 and F2 transmit the force to moveable brake members 507 and 509, respectively. Further, via brake members 507 and 509, the force is transmitted to, and may bend or cause pivoting of, members F3 and F4. Via members F3 and F4, the force further initiates movement of fixation block 502c', which is coupled to pin 504. As result, pin 504 may move toward patterning device MA in the X-direction, as indicated by an arrow adjacent pin 504, to retain the patterning device MA. Bending or pivoting of one or more the members F1-F4 may result in a movement of a respective brake member 507, 509 toward the respective block 503, 505 as indicated by arrows adjacent moveable blocks 507 and 509. Release or reduction of the external force can result in pin 504 moving away from the patterning device MA in the X direction due to the action of one or more of the leaf springs L3, L4 and/or L5.

On contact of the pin 504 with the patterning device MA, the brake members 507 and 509 may contact or engage respectively blocks 503 and 505. Or, following contact of pin 504 with patterning device MA, one or more of members F1-F4 may begin to bend or pivot, or continue bending or pivoting, until the respective brake members 507, 509 contact or engage respective blocks 503, 505. In an embodiment, the brake members 507, 509 move away from each other due to the bending or pivoting. At this time of contact of the pin 504 with the patterning device MA, the movement of the patterning device MA is resisted by, e.g., a friction force between the patterning device MA and one or more contact surfaces (e.g., between the patterning device and one or more projections (such as pin 704) engaging the bottom and/or top surface of the patterning device) and/or by force applied to the patterning device (e.g., another pin 504—see. e.g., FIG. 8B).

On contact or engagement of moveable brake member 507 with block 503, a friction force in the X-direction comes into play. Likewise, upon contact or engagement of moveable brake member 509 with block 505, a friction force in the X-direction comes into play. These friction forces may act as a counteracting force against a force from the patterning device MA (e.g., a force arising from sudden movement of the patterning device MA) to help keep the patterning device MA in position. Thus, these friction forces may effectively prevent movement of the patterning device MA. In this engaged position, brake members 507 and 509 may not slip or slide with respect to blocks 503 and 505, respectively. This essentially non-slip or slide condition is referred to as "self-locking" or "self-locked engagement" of brake members 507, 509 with blocks 503, 505, respectively. In such self-locked engagement positions of brake members 507 and 509, any further increase of external force, e.g., from outer cover 302, will not cause further displacement of pin 504 that contacts patterning device MA. Similarly, due to the self-locking of brake members 507 and 509, a force from the patterning device MA to the pin 504 will not move the brake members 507 and 509 in the X-direction or away from the blocks 503, 505. Should patterning device MA move away from the pin 504 (and thus, e.g., out of contact with pin 504), the external force applied to fixation block 502 would cause the pin 504 to move towards the patterning device MA. In addition, since ground parts 506 are fixed in place using fasteners 508(1)-508(3), any force from patterning device MA that pushes pin 504 will not result in a movement of modified leaf spring mechanism 500' as whole.

In an embodiment, members F1-F4 are each at an angle around the Z-axis from a Y axis through the respective block 503, 505 as illustrated in FIG. 5D. This angle is referred to herein as a flexure angle α. For example, member F1 is at a flexure angle α around the Z-axis from a Y axis through the block 503. The flexure angle of member F1 may vary as the brake member 507 moves and/or engages with block 503. Similar variations may occur for flexure angles of members F2-F4. Such variation in flexure angle may occur upon transmittal or application of an external force to inner pod 304, and/or due to a force from patterning device MA to pin 504.

Upon contact or engagement of brake members 507 and 509 with blocks 503 and 505, respectively, members F1-F4 may be at maximum force of static friction, or may bend or pivot until a maximum force of static friction is achieved, at which point brake members 507 and 509 do not slip on blocks 503 and 505. As noted above, in this condition, brake members 507 and 509 are said to be self-locked with blocks 503 and 505, respectively. When such self-locking is achieved, each one of members F1-F4 are at a maximum self-locking flexure angle.

Figure 5E:
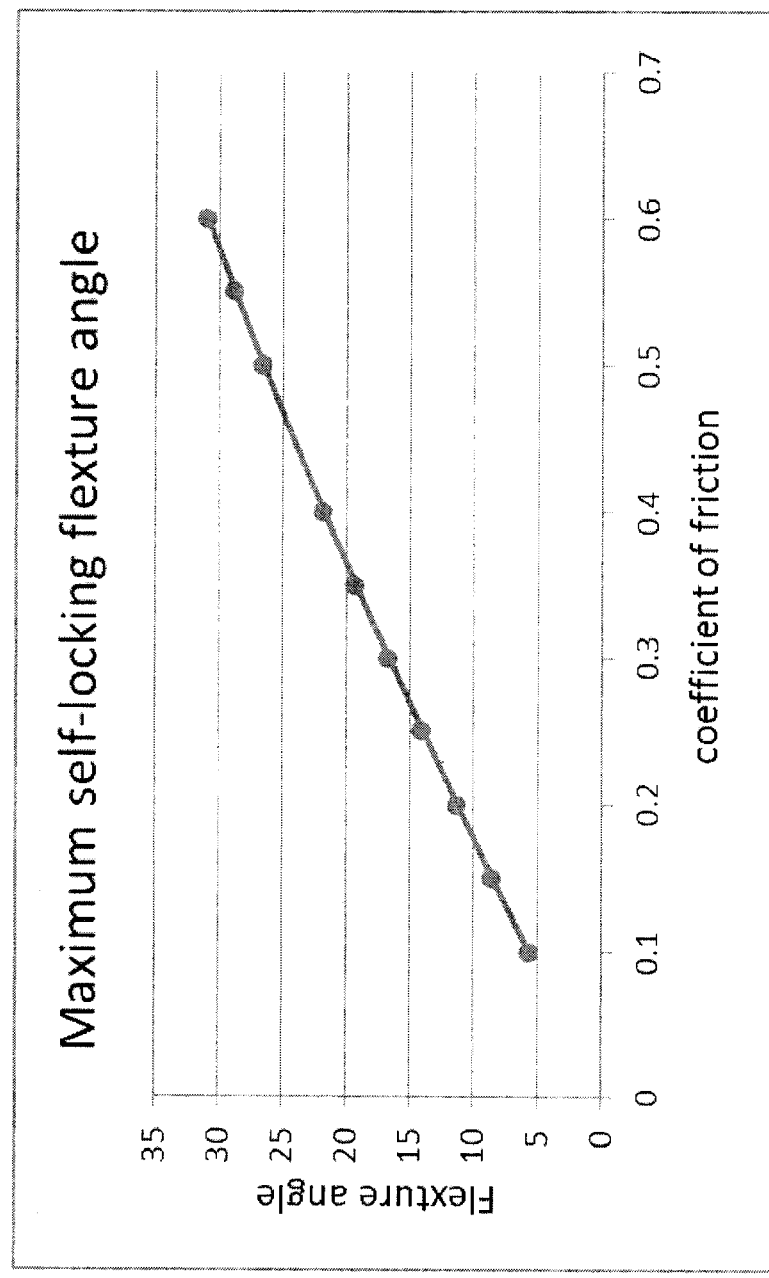
FIG. 5E shows a plot of a relationship between a flexure angle and coefficient of friction on a fixed block according to an embodiment of the invention.

FIG. 5E illustrates the relationship of maximum self-locking angle versus coefficient of friction as plot of the variation of flexure angle α with respect to coefficient of friction μ between brake members 507 and 509 and blocks 503 and 505, respectively. In one embodiment, such variation of flexure angle is linear with respect to coefficient of friction, although other non-linear variations may occur. By way of example only, in one embodiment, for an estimated coefficient of friction μ equal to 0.5 between brake member 507 and block 503 in a dry and clean environment, the maximum self-locking flexure angle is approximately 27°. It is to be noted that such values of α and μ are by way of example only, and not by way of limitation, and these values may change depending on other parameters, e.g., material(s) used for making brake members 505, 507 and/or blocks 503, 505. By implementing the physical arrangement of the members F1-F4, brake members 507, 509, blocks 503, 505 and the general location of the patterning device MA relative to the pin 504, conditions can be provided to keep the flexure angle α at or below the maximum in order to implement self-locking.

The self-locking restraining mechanism implemented using modified leaf spring mechanism 500' provides protection of patterning device MA from sliding, and hence, particle generation. In one embodiment, using the arrangement of FIG. 5D, impact forces of the order of 25 g may be accommodated without any substantial sliding of patterning device MA resulting therefrom. Exemplary advantages of this arrangement include, but are not limited to, limiting damage to the patterning device MA, preventing sliding of patterning device MA even when it is placed asymmetrically, smaller packaging, and inexpensive shipping of a patterning device MA. For example, the self-locking arrangement of FIG. 5D may prevent patterning device MA from sliding in a high-g acceleration impact, and may be used for shipping a patterning device MA.

Figure 6:
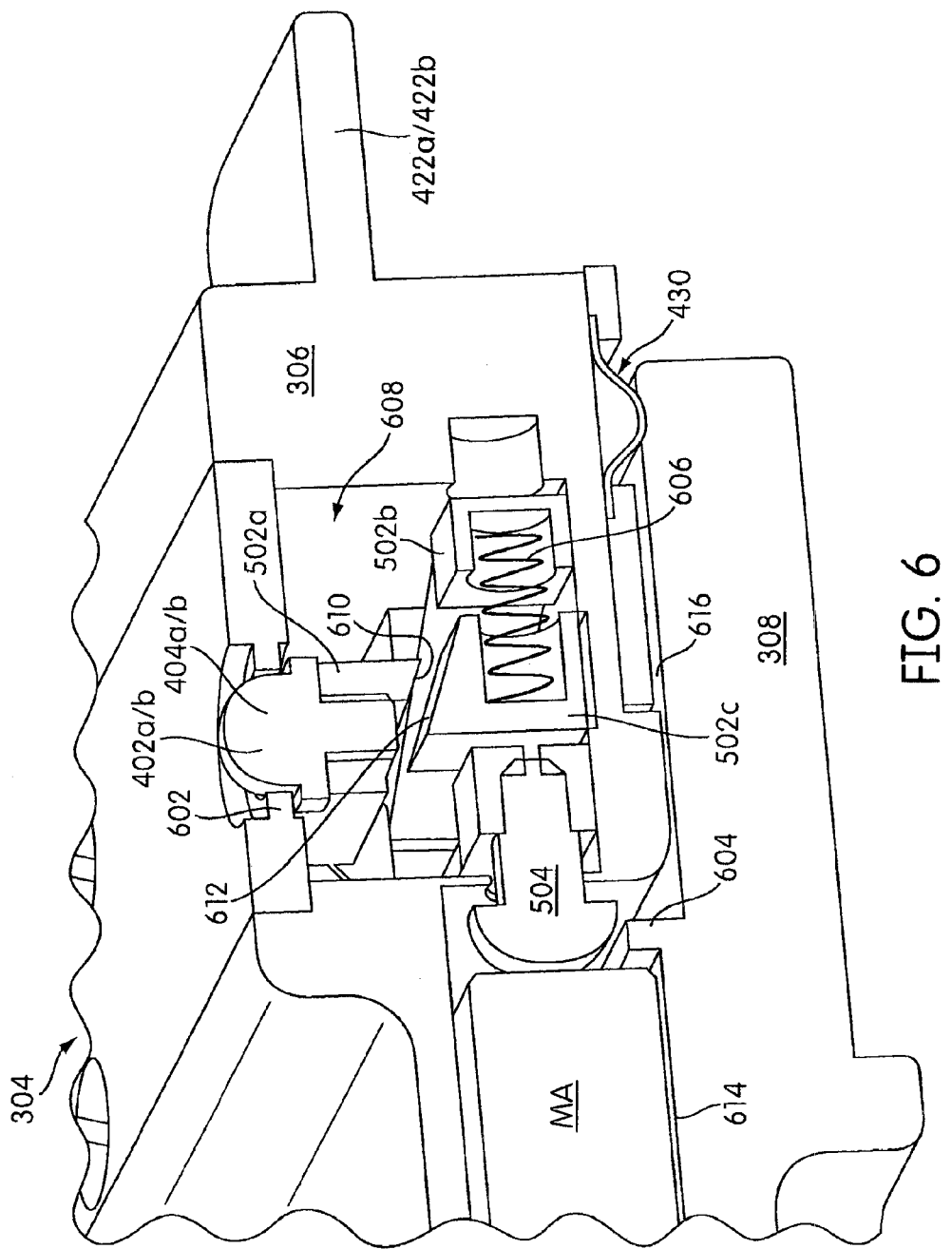
FIG. 6 shows a cross-sectional view of a leaf spring mechanism according to an embodiment of the invention.

FIG. 6 shows a cross-sectional view of inner pod 304 with blocks 502a-502c in operational arrangement with cover 306 brought in contact with base 308 at hollow 430. The pin on fixation block 502a (e.g., one of pins 402a, 402b, 404a, or 404b) is arranged to close a volume 608 via a projection 602 on the top surface of cover 306 that also accommodates the pin (in a similar arrangement, pin 504 can close the volume 608). In this configuration, movement of fixation block 502a down towards base 308 upon application of a force external to inner pod 304 via the pin 402a, 402b, 404a, or 404b causes fixation block 502c to be pushed towards patterning device MA by block 502b and the leaf springs in a single motion of blocks 502a and 502b. Further, when outer cover 302 comes in contact with the pin 402a, 402b, 404a, or 404b or more generally when the pin is pushed further towards fixation block 502c as a result of the external force (e.g., a reactive force opposing the force due to base 308 resting on cover 306), fixation block 502a comes into contact with or into near contact with fixation block 502c via contact or near contact of an angled surface 610 of fixation block 502a with an angled surface 612 of fixation block 502c. As discussed above, this contact or near contact arrangement of the angled surfaces 610, 612 enables a locking opposing force to in-plane movement of patterning device MA to be provided.

Although blocks 502b and 502c are coupled by coil spring 606 to move pin 504 of fixation block 502c towards or away from patterning device MA, another type of spring and/or coupling mechanism could be used. Coil spring 606 may aid in opposing frictional forces due to contact of pin 504 with patterning device MA and or contact of fixation block 502c with second surface 472. As shown in FIG. 6, patterning device MA is placed on an elevated surface 614 separated from a peripheral surface 616 of base 308 by a wall 604. Such separation is advantageous in helping to prevent contaminant particles that might be present in a region above peripheral surface 616 from entering a region above elevated surface 614, resulting in contamination of patterning device MA.

Figure 7A:
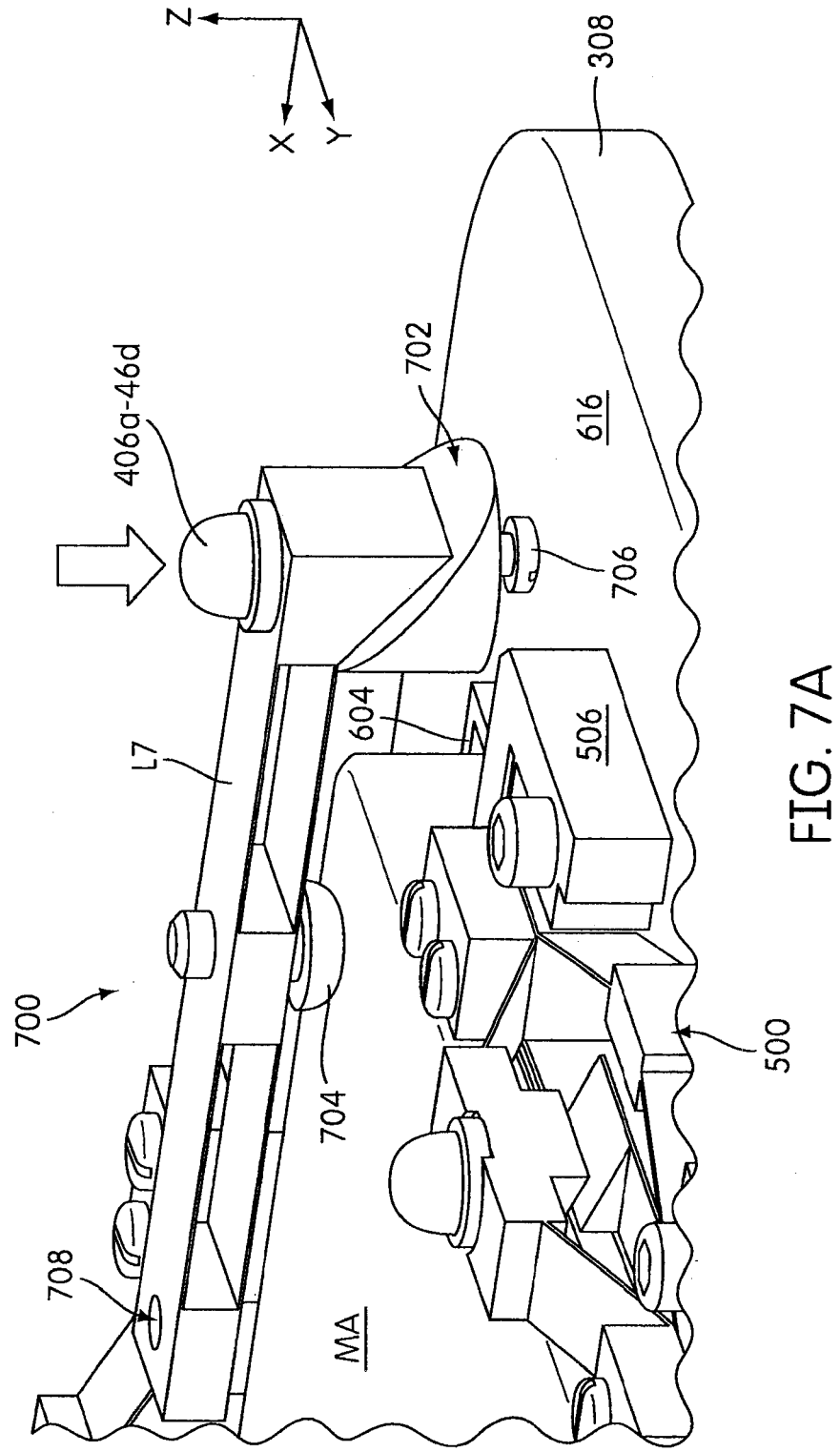
FIGS. 7A and 7B show a leaf spring mechanism to clamp the patterning device according to an embodiment of the invention.
Figure 7B:
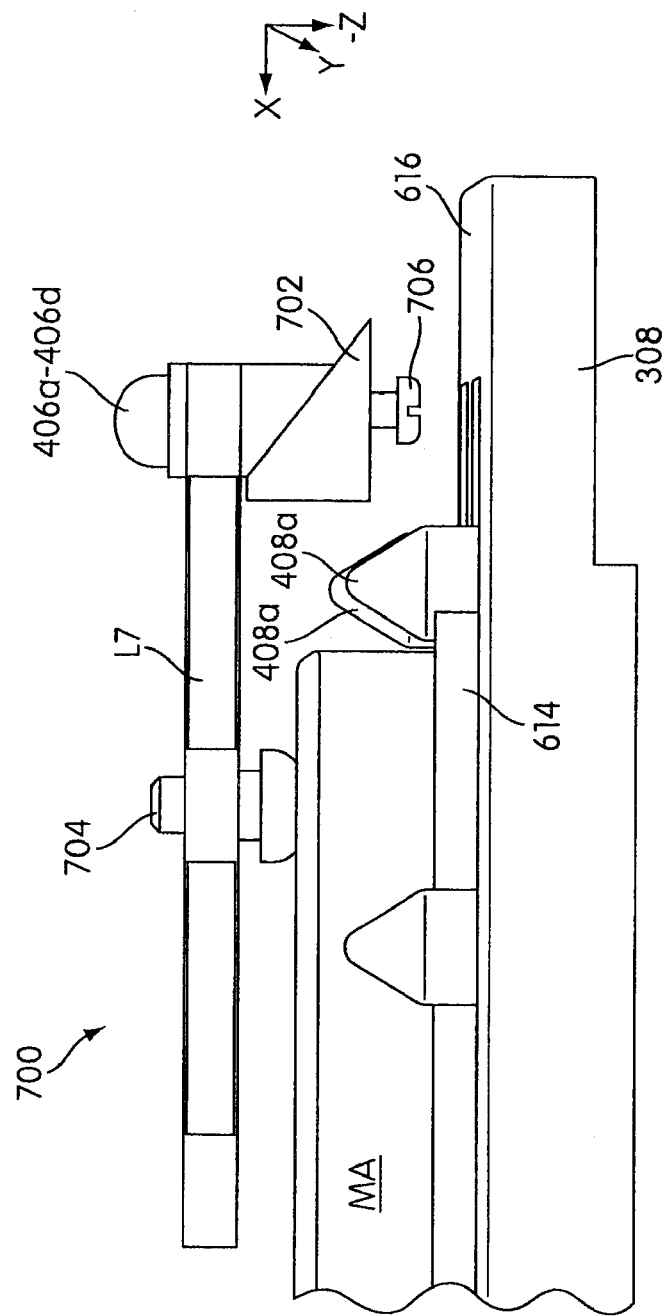

FIG. 7A shows a view of a leaf spring mechanism 700 that has a contact pin 704 and one of pins 406a-406d to restrain patterning device MA in the Z-direction. Contact pin 704 and one of pins 406a-406d are coupled together by a portion of leaf spring 700 formed by a double leaf spring L7. One end 708 of the double leaf spring L7 is connected to the inner cover 306 (not shown). The other end of double leaf spring L7 is coupled to one of the pins 406a-406d. When the pin 406a-406d receives an external force (e.g., from cover 302), it moves downward towards base 308 and comes into contact with or near contact with fixation block 702 inside a volume enclosed by inner cover 306 (not shown). In this arrangement, L7 forms a cantilever leaf spring arrangement configured to receive an external force (e.g., from outer cover 302) at pins 406a-406d coupled to the cantilever leaf spring to clamp patterning device MA using pin 704. Fixation block 702 is arranged to enable a locking opposing force to in-plane movement of patterning device MA to be provided. Such movement by pin 406a-406d may result from base 308 being brought in contact with cover 306. Regardless of the specific arrangement of forces that cause pin 406a-406d to be pushed towards peripheral surface 616, such a motion of the pin causes clamping of patterning device MA by contact pin 704. FIG. 7B shows a side or elevation view of leaf spring mechanism 700. Leaf spring mechanism 500 is not shown in FIG. 7B for visual clarity purposes only. However, FIG. 7B shows three pins 408a-408c on peripheral surface 616 of base 308 that provide a limit to movement of in the X-Y plane substantially parallel to a patterning surface of patterning device MA.

Figure 8A:
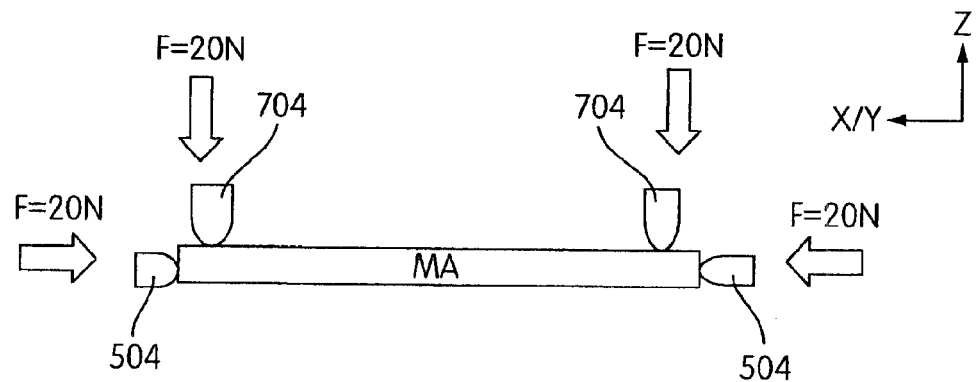
FIGS. 8A and 8B show a distribution of forces on the patterning device according to an embodiment of the invention.
Figure 8B:
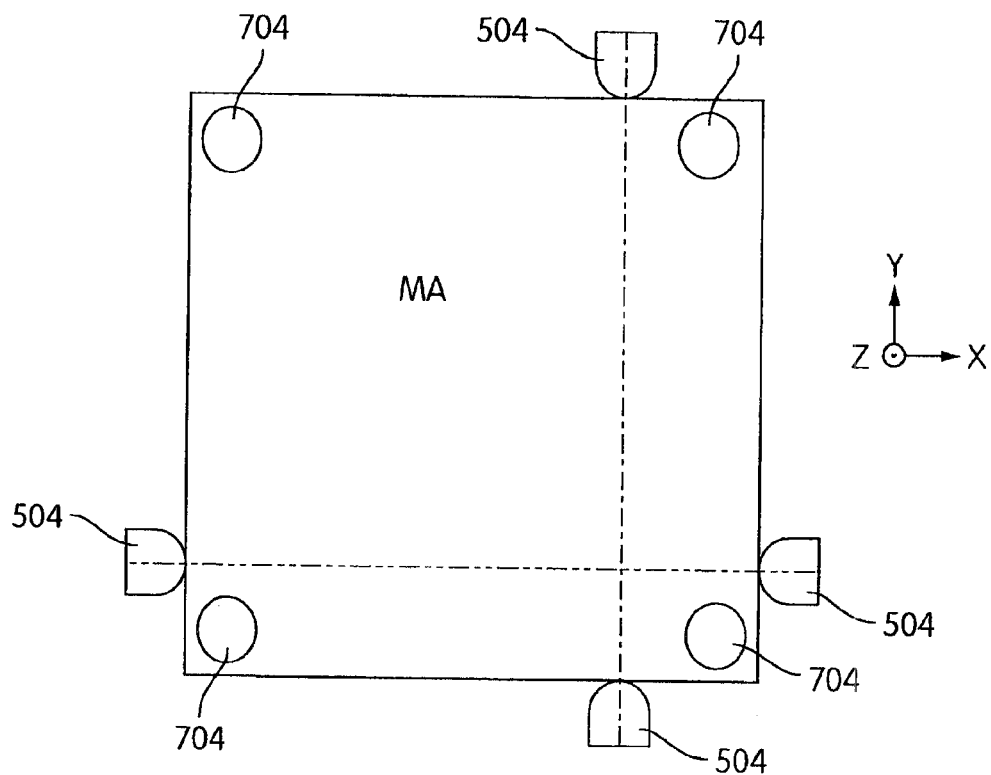

FIGS. 8A and 8B show an exemplary force distribution for patterning device MA in view of contact from pins 704 to restrain patterning device MA in the Z-direction and pins 504 to restrain patterning device MA in the X, Y and $\theta_z$ directions. In this example, when an external force is applied at pins 704 (e.g., when outer cover 302 is brought in contact with inner cover 306), pins 704 are pushed downward towards base 308 to clamp patterning device MA with an exemplary force of 20N at each point of contact with pins 704. Likewise, an in-plane force is provided by leaf spring mechanism 500 to push fixation block 502c (or a part thereof, e.g., pin 504 thereupon) to contact patterning device MA. The in-plane restraining force is provided in a plane substantially parallel to a patterning surface of patterning device MA. Although an exemplary value of 20N force is described in this example, other higher or lower values of forces that are sufficient to restrain patterning device MA in a fixed position, but reducing or minimizing generation of particles by contact and/or sliding of patterning device MA, inner cover 306, inner base 308, outer cover 302, and/or outer cover 310, could be present. FIG. 8B shows a top/plan view of distribution of forces on patterning device MA in the X, Y, and Z directions.

Figure 9A:
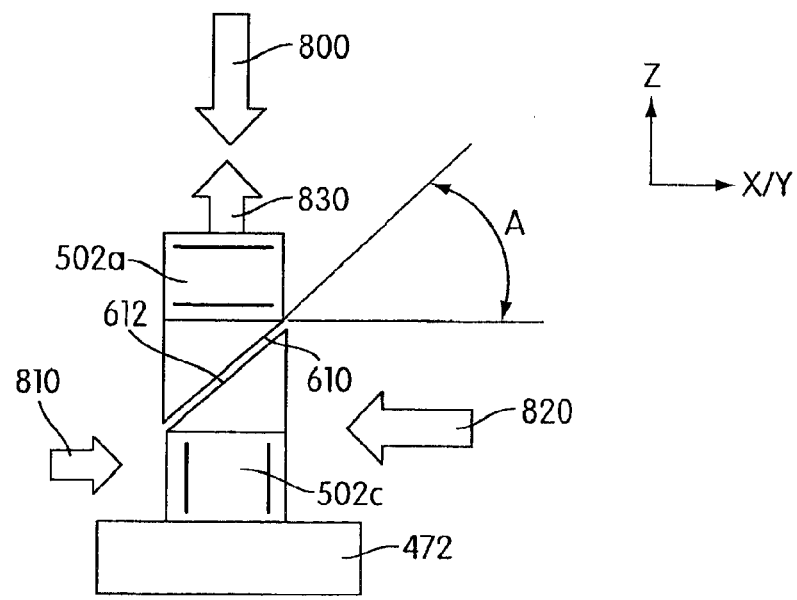
FIGS. 9A and 9B show a distribution of forces and a coupling of movements of parts of the leaf spring mechanism of FIGS. 5A-5C, respectively, according to an embodiment of the invention.

FIG. 9A shows a detailed distribution of forces present at blocks 502a-502c. For example, when inner pod 304 is in a closed configuration with outer cover 302 contacting inner pod 304 and outer base 310, blocks 502a-c cooperate to provide a force to the patterning device MA to retain the patterning device MA in the X-Y plane. In particular, the block 502b, in the inner surface of inner cover 306, via the spring 606 provides a pre-tension force 810 to fixation block 502c and thus patterning device MA, as can be appreciated from the arrangement of the blocks 502a-502c in FIG. 6. If the patterning device MA moves in the X-Y plane (e.g., slides in an uncontrolled manner due to a large external force), the patterning device MA may exert a force 820 to the mechanism 500 via block 502c. If the force 820 exceeds the pre-tension force 810, the excess force 830 may be exerted via block 502c to block 502a. A holding force 800 provided by the outer cover 302 (acting on pins 406a-406d) acts in an opposite direction to such excess force 830 and if greater than the excess force 830 will keep the patterning device MA in place. Thus, the holding force 800 is particularly designed to keep angled surfaces 610 and 612 of fixation blocks 502a and 502c, respectively, in sliding contact with each other should there be an excess force 830. Thus, the holding force 800 is designed to be significantly high to counteract possible expected forces exerted by the patterning device MA (e.g., the holding force 800 may be designed for 30 g or more forces applied by the patterning device MA). An angle A formed between surface 612 of fixation block 502c and surface 610 of fixation block 502a may be an acute angle with respect to a direction of the in-plane force. In an embodiment, angle A may be obtuse.

Figure 9B:
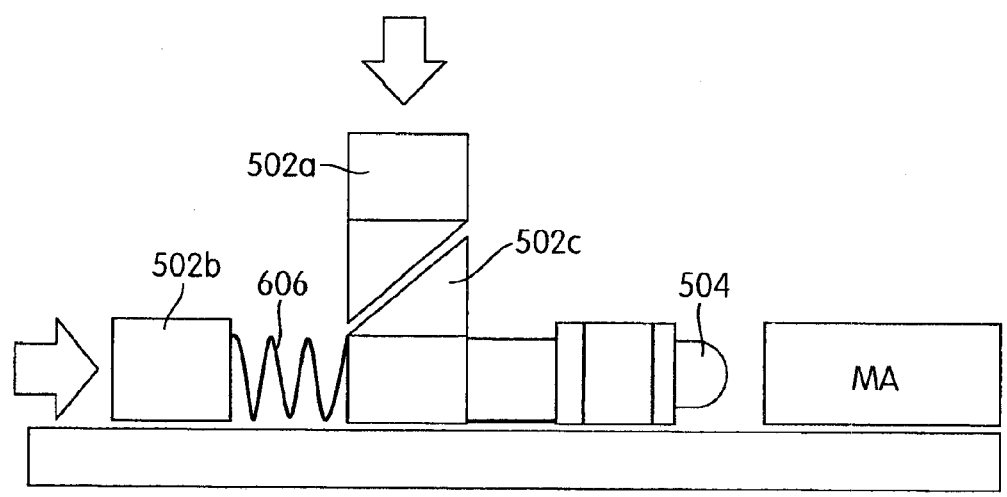

FIG. 9B shows an exemplary coupling of movements of blocks 502a-502c of leaf spring mechanism 500 to restrain patterning device MA in a substantially fixed configuration. For example, as outer cover 302 is brought in contact with pins 406a-406d in a Z-direction towards base 308, fixation block 502a is moved towards base 308 which causes block 502b and pin 504 to simultaneously move towards patterning device MA by leaf spring mechanism 500, as described in FIGS. 5A-5C. Such motion of block 502b further causes fixation block 502c to move towards patterning device MA. As noted earlier, additionally or optionally, coil spring 606 may be used to facilitate such movement of block 502b and fixation block 502c.

Figure 10:
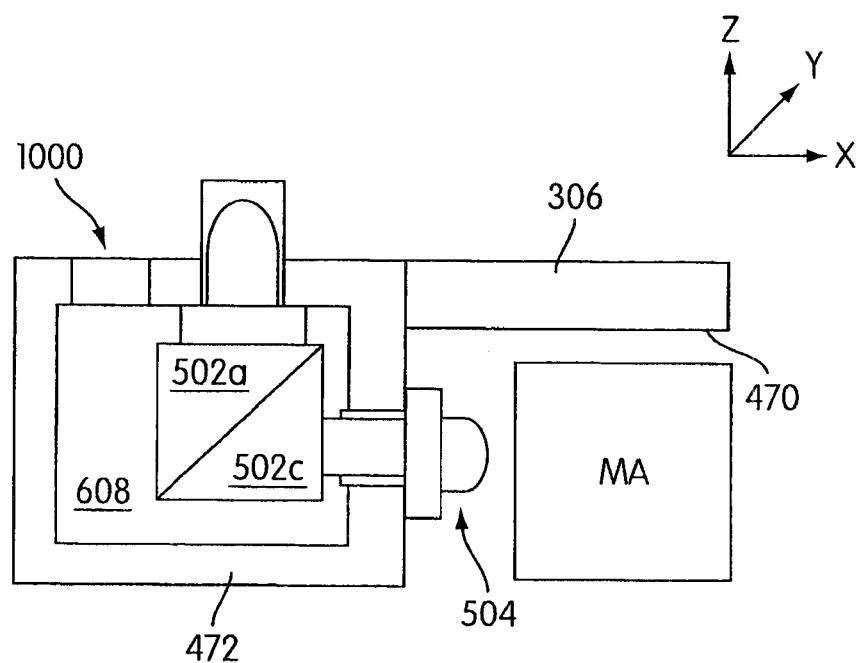
FIG. 10 depicts a schematic of a filter arrangement to hinder or prevent movement of contaminant particles from or to the EUV inner pod according to an embodiment of the invention.

FIG. 10 illustrates a location of a filtering mechanism according to an embodiment of the invention. The filter arrangement includes a filter 1000 below or as part of each filter cover 420a-420d. Each filter 1000 that is a part of filter covers 420a-420d may be isolated from the other filters. For example, each filter cover 420 and associated filter 1000 may assigned to a particular substantially closed volume associated with a particular leaf spring mechanism 500 and 700. Filter 1000 may be a bi-directional or two-way filter used for both pumping gas into inner pod 304 (e.g., volume 608), and for venting gas from inner pod 304 (e.g., volume 608), as described in more detail in FIG. 11A. In the example arrangement shown in FIG. 10, filter 1000 is close to leaf spring mechanisms 500 and 700, although the filtering mechanism shown in FIG. 10 may be located anywhere on a surface of cover 306. Filter 1000 may include bi-directional or uni-directional filters. In an embodiment, the filter is arranged to allow most, if not all, particles to pass out of the inner pod 304 into a space outside of the inner pod 304 but not to let any, or only few, particles to into the inner pod 304. In an embodiment, the filter is arranged to collect particles whether gas is being supplied into inner pod 304 or gas is being vented from inner pod 304. The filtering mechanism facilitates maintaining a substantially particle free environment for patterning device MA. For example, pumping gas into volume 608 may cause particles present in volume 608 to be displaced and removed when such gas is vented at a later stage of filtering. In an embodiment, filter 1000 traps particles and when filter 1000 is removed from inner cover 306, such particles may be permanently discarded (manually or automatically using a robotic arm, for example) through disposal or cleaning of the filter 1000.

Figure 11:
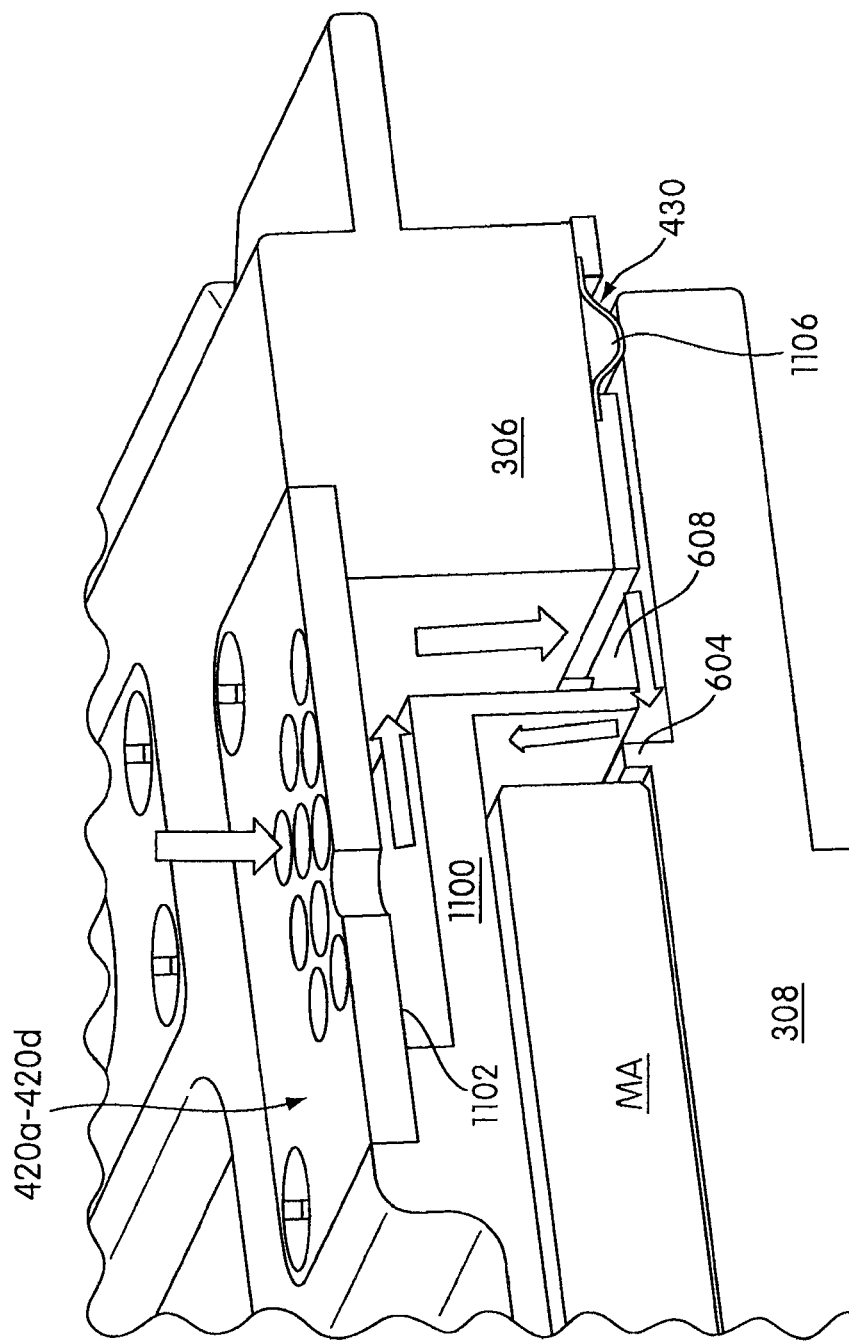
FIG. 11 shows a cross-sectional view of a filter arrangement according to an embodiment of the invention.

FIG. 11 shows a flow of gas pumped through an embodiment of a filtering mechanism. The direction of flow of the gas in volume 608 is shown by way of block arrows. Gas enters volume 608 via a filter cover 420a-420d. The gas is filtered by filter 1000 and is directed by a surface formed by a plate 1100 above patterning device MA into volume 608. During venting, gas flows out of inner pod 304 and can be shown by reversing the direction of arrows. Particles present in volume 608 are displaced by the venting force towards an inner surface 1102 of filter 1000 during venting out of gas from volume 608. Advantageously, during pumping and/or venting, since filter 1100 is at least a portion away from patterning device MA, particles at the filter 1000 (e.g., particles that manage to penetrate through filter 1000 into volume 608 or trapped at the inner surface 1102) do not impinge on patterning device MA. Instead, such particles fall or are blown onto plate 1100, thereby reducing or preventing contamination of patterning device MA. Volume 608 is sealed at a contact point between inner cover 306 and inner base 308 by a seal 1106 at hollow 430. The seal 1106 provides for design flexibility for inner pod 304 since inner base 308 and inner cover 306 do not have to be of high flatness. Seal 1106 may be made of a material that has a low compression force and a stroke of 0.3 mm, for example.

FIGS. 12A-12C show a groove arrangement to restrain movement of inner cover 306 when in contact with inner base 308. In this embodiment, the groove mechanism comprises three (3) V-shaped grooves V4-V6 attached to peripheral surface 616 of base 308, although other numbers and shapes of grooves may be used. FIG. 12A illustrates the groove arrangement with patterning device MA removed for visual clarity purposes only. It is to be noted that V-shaped grooves V4-V6 may be located at other locations on peripheral surface 616 of inner base 308. FIG. 12B shows a close-up view of one of the V-shaped grooves V4 or V5. For example, V-shaped groove V4 or V5 is arranged to receive one of the contact pins/balls B1 or B2 on second surface 470 of inner cover 306, as shown in FIG. 4C. In an embodiment, V-shaped grooves V4-V6 are separable from the base 308 and are attached to the peripheral surface 616 of base 308 by one or more screws 1200 although other mechanisms to attach the V-shaped grooves V4-V6 to the base 308 may be used. FIG. 12C shows additional views of the groove arrangement with V-shaped groove V6 receiving ball B3 of inner cover 306, including a cross-sectional view showing inner cover 306 with ball B3 resting on V-shaped groove V6.

Figure 13:
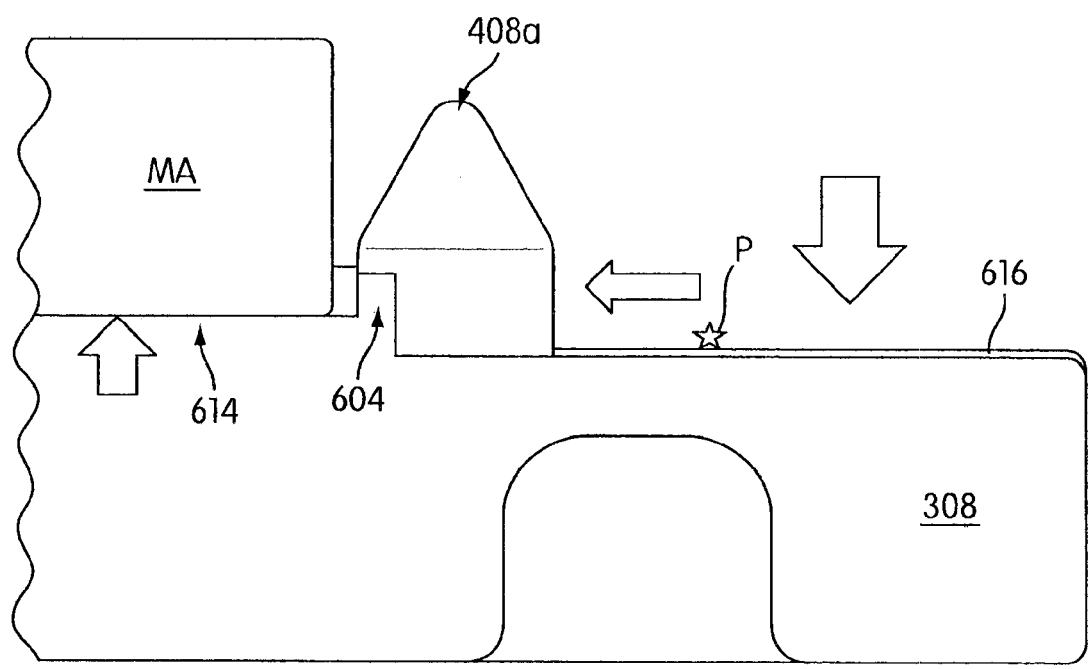
FIG. 13 shows an arrangement of a mesa to hinder or prevent particles from entering a volume over the patterning device according to an embodiment of the invention.

FIG. 13 illustrates protection/isolation of patterning device MA from a particle P generated as a result of contact and/or sliding between various components of inner pod 304. In this example, particle P is on peripheral surface 616 of inner base 308. However, wall 604 blocks entry of particle P in an area on or above patterning device MA. Additionally, patterning device MA is placed on elevated surface 614 separated from a peripheral surface 616 of base 308 by the wall 604. As a result of the wall 604 and/or elevation of surface 614, a probability of particle P coming into contact with the patterning device MA, particularly the surface of the patterning device MA facing the base 308, is reduced.

According to an embodiment of the invention, there is provided a method of processing a patterning device MA using a container 300. Patterning device MA is configured to impart the beam of radiation with a pattern in its cross-section. The method includes placing patterning device MA upon a base 308, coupling an inner cover 306 to the base 308. Inner cover 306 has a restraining mechanism that, upon an application of a force external to inner cover 306, is configured to provide an in-plane force to patterning device MA to restrain movement of the patterning device MA. The in-plane force is in a plane substantially parallel to a patterning surface of patterning device MA. The method further includes coupling the patterning device MA to a support structure MT of a lithographic apparatus 1 that includes illuminator IL adapted to condition the beam of radiation, a substrate table WT configured to hold a substrate W, and a projection system PS configured to project a patterned beam from the patterning device MA onto a target portion of substrate W. Furthermore, the method includes filtering contaminants from a volume over or adjacent the patterning device MA using a filter 1000. Filter 1000 is not directly above patterning device MA but is separated therefrom by plate 1100, as shown for example, in FIG. 11.

In an embodiment, there is provided an apparatus, comprising: a base configured to support a patterning device configured to impart a beam of radiation with a pattern in its cross-section; and an inner cover couplable to the base, the inner cover comprising a restraining mechanism that, upon an application of a force external to the inner cover, is configured to provide an in-plane force to the patterning device to restrain movement of the patterning device, the in-plane force being substantially parallel to a patterning surface of the patterning device.

In an embodiment, the apparatus further comprises an outer cover couplable to the inner cover to apply the force external to the inner cover at at least one point on the inner cover. In an embodiment, the restraining mechanism comprises a leaf spring mechanism to convert the external force into the in-plane force. In an embodiment, the leaf spring mechanism comprises: a first leaf spring coupled to a first block; and a second leaf spring coupled to a second block and coupled to the first leaf spring, wherein the first block is arranged to receive the external force. In an embodiment, upon application of the external force, the first block moves towards the base in a plane substantially perpendicular to the patterning surface to cause the second block to move in a plane substantially parallel to the patterning surface. In an embodiment, the movement of the second block is configured to push a third block of the restraining mechanism towards the patterning device to provide the in-plane force, the third block contacting the patterning device. In an embodiment, the second block and the third block are coupled together by a spring such that when the third block is in contact with the patterning device, the spring is in a compressed state to oppose movement of the patterning device. In an embodiment, the first block has a surface that couples to a surface of the third block such that movement of the third block caused by force from the patterning device is restrained by the surface of the first block in order to restrain movement of the patterning device. In an embodiment, the movement of the first block causes the first leaf spring to move from a first position to a second position, further causing the second leaf spring to move from a third position to a fourth position, wherein the movement of the second block is actuated by the movement of the second leaf spring, the movement of the first leaf spring being substantially perpendicular to the movement of the second leaf spring. In an embodiment, the base comprises a first surface elevated relative to a second peripheral surface of the base, wherein, in use, the patterning device is supported on the first surface or located within a wall defined by the first surface. In an embodiment, the restraining mechanism further comprises a cantilever leaf spring attached at one end to the inner cover and configured to receive a force external to the inner cover at another end, the external force causing, in a use, a pin of the cantilever leaf spring to contact the patterning device. In an embodiment, the base comprises a V-shaped groove to accommodate a corresponding pin of the inner cover when the inner cover and the base are in contact. In an embodiment, the V-shaped groove is removable from the base. In an embodiment, the apparatus comprises a seal to provide the only contact between the inner cover and the base to protect the patterning device from particles or contaminants outside the inner cover. In an embodiment, the inner cover comprises a filter arranged such that at least a portion of the filter that is above the patterning device is separated from the patterning device by a structure to prevent contamination particles at the filter from falling or impinging directly onto the patterning device. In an embodiment, the filter is mechanically isolated from another filter of the inner cover. In an embodiment, the restraining mechanism comprises: a moveable brake member to receive the force; and a block, fixed relative to the brake member, to engage with the moveable brake member. In an embodiment, the moveable brake member is part of or coupled to a pivotable or flexible member and wherein, upon or when the restraining mechanism engages the patterning device, the pivotable or flexible member is or becomes located at a self-locking angle relative to the block.

In an embodiment, there is provided a method to process a patterning device configured to impart a beam of radiation with a pattern in its cross-section, the method comprising: placing the patterning device upon a base; coupling an inner cover to the base, the inner cover comprising a restraining mechanism; and applying a force external to the inner cover to the restraining mechanism such that the restraining mechanism provides an in-plane force to the patterning device to restrain movement of the patterning device, the in-plane force being substantially parallel to a patterning surface of the patterning device.

In an embodiment, the application of the force external to the inner cover is performed by bringing an outer cover in contact with the inner cover at at least one point on the inner cover. In an embodiment, the base comprises a first surface elevated relative to a second peripheral surface of the base and wherein the placing comprises placing the patterning device on the first surface or on a region located within a wall defined by the first surface. In an embodiment, the method further comprises filtering contaminants over or adjacent the patterning device using a filter, wherein the filter is not directly above the patterning device but is separated therefrom by a structure. In an embodiment, the method further comprises using the force to move a moveable brake member to engagement with a block fixed relative to the brake member. In an embodiment, the method further comprises pivoting or bending a member, part of or coupled to the brake member, to a self-locking angle relative to the block upon, or when, the restraining mechanism engages the patterning device.

In an embodiment, there is provided an apparatus comprising: a base configured to support a patterning device configured to impart a beam of radiation with a pattern in its cross-section; and a restraining mechanism comprising: a first member part of or coupled to a first brake member, the first member configured to move in a first direction in response to an external force to bend or pivot the first member; a first block configured to engage the first brake member, wherein the first member is configured to move the first brake member into engagement with the first block; and a pin, coupled to the first member and/or the first brake member, configured to transmit a force in the first direction to the patterning device and to substantially prevent the patterning device from movement.

In an embodiment, the apparatus further comprises a second member part of or coupled to the first brake member, the second member configured to move in the first direction in response to the external force to bend or pivot the second member, wherein the pin is part of or coupled to the second member. In an embodiment, the apparatus further comprises a third member part of or coupled to a second brake member, the third member configured to move in the first direction in response to the external force to bend or pivot the third member; a second block configured to engage the second brake member, wherein the third member is configured to move the second brake member into engagement with the second block; and a fourth member part of or coupled to the second brake member, the fourth member configured to move in the first direction in response to the external force to bend or pivot the fourth member, wherein the pin is part of or coupled to the fourth member. In an embodiment, the first, the second, the third, or the fourth member is arranged to pivot or bend at an angle with respect to a line substantially perpendicular to the first direction. In an embodiment, the angle varies up to a value at or after which a change in the external force and/or a change in a force from the patterning device does not substantially change the angle, the force from the patterning device being in a substantially opposite direction to the first direction. In an embodiment, upon reaching or exceeding the value, the first, the second, the third, or the fourth member is in a self-locked engagement to the first block or the second block, respectively, and does not substantially slip on the first block or the second block, respectively. In an embodiment, the restraining mechanism further comprises a leaf spring mechanism configured to bend to aid movement of the pin in the first direction in response to the external force. In an embodiment, the force in the first direction to the patterning device is an in-plane force substantially parallel to a patterning surface of the patterning device. In an embodiment, the restraining mechanism is inside a cover coupled to the base.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The lithographic apparatus may also be of a type wherein a surface of the substrate is immersed in a liquid having a relatively high refractive index, e.g. water, so as to fill a space between a final element of the projection system and the substrate. Immersion liquids may also be applied to other spaces in the lithographic apparatus, for example, between the patterning device and a first element of the projection system. Immersion techniques are well known in the art for increasing the numerical aperture of projection systems.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions configured to cause performance of a method as disclosed above, or a computer-readable data storage medium (e.g. semiconductor memory, magnetic or optical disk) having such a computer program stored therein.

The descriptions above are intended to be illustrative, not limiting. Thus, it will be apparent to those skilled in the art that modifications may be made to the invention as described without departing from the scope of the claims set out below.

What is claimed is:

1. An apparatus, comprising:
a base configured to support a patterning device, the patterning device configured to impart a beam of radiation with a pattern in its cross-section; and
a cover couplable to the base, the cover comprising a restraining mechanism that, upon an application of a force external to the cover, is configured to provide an in-plane force to the patterning device to restrain movement of the patterning device, the in-plane force being substantially parallel to a patterning surface of the patterning device and applied via a structure of the restraining mechanism arranged to only contact a side of the patterning device transverse to the patterning surface, the side having an edge, and arranged to apply the in-plane force without substantial sliding contact between the structure and the side and edge of the patterning device.

2. The apparatus of claim 1, wherein the cover is an inner cover and further comprising an outer cover couplable to the inner cover to apply the force external to the inner cover at at least one point on the inner cover.

3. The apparatus of claim 1, wherein the restraining mechanism comprises a leaf spring mechanism to convert the external force into the in-plane force.

4. The apparatus of claim 1, wherein the base comprises a first surface elevated relative to a second peripheral surface of the base, wherein, in use, the patterning device is supported on the first surface or located within a wall defined by the first surface.

5. The apparatus of claim 1, wherein the restraining mechanism further comprises a cantilever leaf spring attached at one end to the cover and configured to receive a force external to the cover at another end, the external force causing, in a use, a pin of the cantilever leaf spring to contact the patterning device.

6. The apparatus of claim 1, wherein the base comprises a V-shaped groove to accommodate a corresponding pin of the cover when the cover and the base are in contact.

7. The apparatus of claim 6, wherein the V-shaped groove is removable from the base.

8. The apparatus of claim 1, comprising a seal to provide the only contact between the cover and the base to protect the patterning device from particles or contaminants outside the cover.

9. The apparatus of claim 1, wherein the cover comprises a filter arranged such that at least a portion of the filter that is above the patterning device is separated from the patterning device by a structure to prevent contamination particles at the filter from falling or impinging directly onto the patterning device.

10. The apparatus of claim 9, wherein the filter is mechanically isolated from another filter of the cover.

11. The apparatus of claim 1, wherein the restraining mechanism comprises:
a moveable brake member to receive the force; and
a block, fixed relative to the brake member, to engage with the moveable brake member.

12. The apparatus of claim 11, wherein the moveable brake member is part of or coupled to a pivotable or flexible member and wherein, upon or when the restraining mechanism engages the patterning device, the pivotable or flexible member is or becomes located at a self-locking angle relative to the block.

13. An apparatus, comprising:
a base configured to support a patterning device, the patterning device configured to impart a beam of radiation with a pattern in its cross-section; and
a cover couplable to the base, the cover comprising a restraining mechanism that, upon an application of a force external to the cover, is configured to provide an in-plane force to the patterning device to restrain movement of the patterning device, the in-plane force being substantially parallel to a patterning surface of the patterning device, wherein the restraining mechanism comprises a leaf spring mechanism to convert the external force into the in-plane force and the leaf spring mechanism comprises:
a first leaf spring coupled to a first block; and
a second leaf spring coupled to a second block and coupled to the first leaf spring, wherein the first block is arranged to receive the external force.

14. The apparatus of claim 13, wherein upon application of the external force, the first block moves towards the base in a plane substantially perpendicular to the patterning surface to cause the second block to move in a plane substantially parallel to the patterning surface.

15. The apparatus of claim 14, wherein the movement of the second block is configured to push a third block of the restraining mechanism towards the patterning device to provide the in-plane force, the third block contacting the patterning device.

16. The apparatus of claim 15, wherein the second block and the third block are coupled together by a spring such that when the third block is in contact with the patterning device, the spring is in a compressed state to oppose movement of the patterning device.

17. The apparatus of claim 16, wherein the first block has a surface that couples to a surface of the third block such that movement of the third block caused by force from the patterning device is restrained by the surface of the first block in order to restrain movement of the patterning device.

18. The apparatus of claim 13, wherein the movement of the first block causes the first leaf spring to move from a first position to a second position, further causing the second leaf spring to move from a third position to a fourth position, wherein the movement of the second block is actuated by the movement of the second leaf spring, the movement of the first leaf spring being substantially perpendicular to the movement of the second leaf spring.

19. A method to process a patterning device configured to impart a beam of radiation with a pattern in its cross-section, the method comprising:
 placing the patterning device upon a base;
 coupling a cover to the base, the cover comprising a restraining mechanism; and
 applying a force external to the cover to the restraining mechanism such that the restraining mechanism provides an in-plane force to the patterning device to restrain movement of the patterning device, the in-plane force being substantially parallel to a patterning surface of the patterning device and applied via a structure of the restraining mechanism arranged to only contact a side of the patterning device transverse to the patterning surface, the side having an edge, and arranged to apply the in-plane force without substantial sliding contact between the structure and the side and edge of the patterning device.

20. The method of claim 19, wherein the application of the force external to the cover is performed by bringing an outer cover in contact with the cover at at least one point on the cover.

21. The method of claim 19, wherein the base comprises a first surface elevated relative to a second peripheral surface of the base and wherein the placing comprises placing the patterning device on the first surface or on a region located within a wall defined by the first surface.

22. The method of claim 19, further comprising filtering contaminants over or adjacent the patterning device using a filter, wherein the filter is not directly above the patterning device but is separated therefrom by a structure.

23. The method of claim 19, further comprising using the force to move a moveable brake member to engagement with a block fixed relative to the brake member.

24. The method of claim 23, further comprising pivoting or bending a member, part of or coupled to the brake member, to a self-locking angle relative to the block upon, or when, the restraining mechanism engages the patterning device.

25. An apparatus comprising:
 a base configured to support a patterning device, the patterning device configured to impart a beam of radiation with a pattern in its cross-section; and
 a restraining mechanism comprising:
  a first member part of or coupled to a first brake member, the first member configured to move in a first direction in response to an external force to bend or pivot the first member;
  a first block configured to engage the first brake member, wherein the first member is configured to move the first brake member into engagement with the first block; and
  a pin, coupled to the first member and/or the first brake member, configured to transmit a force in the first direction to the patterning device and to substantially prevent the patterning device from movement.

26. The apparatus of claim 25, further comprising a second member part of or coupled to the first brake member, the second member configured to move in the first direction in response to the external force to bend or pivot the second member, wherein the pin is part of or coupled to the second member.

27. The apparatus of claim 26, further comprising:
 a third member part of or coupled to a second brake member, the third member configured to move in the first direction in response to the external force to bend or pivot the third member;
 a second block configured to engage the second brake member, wherein the third member is configured to move the second brake member into engagement with the second block; and
 a fourth member part of or coupled to the second brake member, the fourth member configured to move in the first direction in response to the external force to bend or pivot the fourth member, wherein the pin is part of or coupled to the fourth member.

28. The apparatus of claim 27, wherein the first, the second, the third, or the fourth member is arranged to pivot or bend at an angle with respect to a line substantially perpendicular to the first direction.

29. The apparatus of claim 28, wherein the angle varies up to a value at or after which a change in the external force and/or a change in a force from the patterning device does not substantially change the angle, the force from the patterning device being in a substantially opposite direction to the first direction.

30. The apparatus of claim 29, wherein upon reaching or exceeding the value, the first, the second, the third, or the fourth member is in a self-locked engagement to the first block or the second block, respectively, and does not substantially slip on the first block or the second block, respectively.

31. The apparatus of claim 25, wherein the restraining mechanism further comprises a leaf spring mechanism configured to bend to aid movement of the pin in the first direction in response to the external force.

32. The apparatus of claim 25, wherein the force in the first direction to the patterning device is an in-plane force substantially parallel to a patterning surface of the patterning device.

33. The apparatus of claim 25, wherein the restraining mechanism is inside a cover coupled to the base.

* * * * *